United States Patent
Uchida et al.

(10) Patent No.: US 10,090,489 B2
(45) Date of Patent: Oct. 2, 2018

(54) ORGANIC ELECTROLUMINESCENCE APPARATUS, MANUFACTURING METHOD FOR SAME, ILLUMINATION APPARATUS, AND DISPLAY APPARATUS

(71) Applicant: Sharp Kabushiki Kaisha, Sakai, Osaka (JP)

(72) Inventors: Hideki Uchida, Sakai (JP); Katsuhiro Kikuchi, Sakai (JP); Yoshiyuki Isomura, Sakai (JP); Eiji Koike, Sakai (JP); Satoshi Inoue, Sakai (JP); Yuto Tsukamoto, Sakai (JP); Masanori Ohara, Sakai (JP); Kazuki Matsunaga, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 86 days.

(21) Appl. No.: 15/506,285

(22) PCT Filed: Aug. 20, 2015

(86) PCT No.: PCT/JP2015/073410
§ 371 (c)(1),
(2) Date: Feb. 24, 2017

(87) PCT Pub. No.: WO2016/031679
PCT Pub. Date: Mar. 3, 2016

(65) Prior Publication Data
US 2018/0226615 A1    Aug. 9, 2018

(30) Foreign Application Priority Data

Aug. 26, 2014  (JP) ................................. 2014-171632

(51) Int. Cl.
*H01L 51/52* (2006.01)
*G09G 3/3208* (2016.01)

(52) U.S. Cl.
CPC ...... *H01L 51/5271* (2013.01); *H01L 51/5209* (2013.01); *H01L 51/5268* (2013.01); *G09G 3/3208* (2013.01)

(58) Field of Classification Search
CPC . H01L 51/5271; H01L 51/5209; H01L 51/00; H01L 51/001; H01L 51/0011;
(Continued)

(56) References Cited

U.S. PATENT DOCUMENTS

2010/0090592 A1    4/2010  Shiobara et al.
2012/0007066 A1*   1/2012  Kawakami .......... C07D 209/86
                                                    257/40
(Continued)

FOREIGN PATENT DOCUMENTS

JP    2003-229283 A    8/2003
JP    2006-294491 A    10/2006
(Continued)

OTHER PUBLICATIONS

Official Communication issued in International Patent Application No. PCT/JP2015/073410, dated Nov. 24, 2015.

*Primary Examiner* — Chuong A Luu
(74) *Attorney, Agent, or Firm* — Keating & Bennett, LLP

(57) ABSTRACT

An organic EL device according to one aspect of the present invention includes: a base material in which a recess is provided at an upper surface of the base material; a reflective layer that is provided at least along a surface of the recess; a filling layer that is filled into an inside of the recess via the reflective layer, the filling layer having light transmissivity; a first electrode that is provided at least on a layer above the filling layer, the first electrode having light transmissivity; an organic layer that is provided on a layer above the first electrode, the organic layer comprising at least a light-emitting layer; and a second electrode that is provided on a layer above the organic layer, the second electrode having
(Continued)

light transmissivity and light reflectivity. A part of the reflective layer contacts a part of the first electrode.

14 Claims, 12 Drawing Sheets

(58) Field of Classification Search
CPC ..... H01L 51/0097; H01L 51/50; H01L 51/52; H01L 51/5253; H01L 51/5275; H01L 51/56; H01L 51/5012; H01L 51/5259; H01L 51/5246; H01L 51/5268; H01L 51/5212; H01L 51/5218; H01L 51/5234; H01L 51/5281; H01L 51/0077
USPC .......................................................... 257/40
See application file for complete search history.

(56) References Cited

U.S. PATENT DOCUMENTS

| | | | |
|---|---|---|---|
| 2016/0172626 A1* | 6/2016 | Suzuka | ............... H01L 51/5259 257/40 |
| 2016/0271633 A1* | 9/2016 | Kim | ................... H01L 51/0011 |
| 2016/0380234 A1* | 12/2016 | Saito | ................... H01L 51/5088 257/40 |

FOREIGN PATENT DOCUMENTS

| | | |
|---|---|---|
| JP | 2010-114428 A | 5/2010 |
| JP | 2011-108531 A | 6/2011 |

* cited by examiner

ORGANIC ELECTROLUMINESCENCE APPARATUS, MANUFACTURING METHOD FOR SAME, ILLUMINATION APPARATUS, AND DISPLAY APPARATUS

TECHNICAL FIELD

The present invention relates to an organic electroluminescence device, a production method for an organic electroluminescence device, an illumination device, and a display device.

The subject application claims priority based on the patent application No. 2014-171632 filed in Japan on Aug. 26, 2014 and incorporates by reference herein the content thereof.

BACKGROUND ART

One known form of display device is a self-light-emitting type display device such as an organic electroluminescence display device. Electroluminescence will be abbreviated EL herein. In an organic EL display device, light emitted from a light-emitting layer progresses in all directions, and a part of the light is totally reflected by the difference in refractive indexes between the light-emitting element and an external space (air). A large amount of the light totally reflected at the boundary between the light-emitting element and air is bound within the light-emitting element, and is not extracted to the external space. For example, if the refractive index of the external space is 1.8, of the light emitted from the light-emitting layer, approximately 20% is extracted to the external space, and the remaining approximately 80% is bound within the light-emitting layer. In this manner, a conventional organic EL device has the problem of a low light usage efficiency.

In Patent Document 1 noted below, an organic EL display device that has a carrier substrate, an organic EL element provided on the carrier substrate, and a light-reflecting layer that reflects light emitted from the organic EL element is disclosed. In the organic EL display device, a recess that includes an inclined surface along the outer edge of an organic light-emitting layer is provided in the light-reflecting layer. Light emitted from the light-emitting layer, after being reflected at the inclined surface of the recess, returns toward the organic EL element once again. By this constitution, in addition to preventing image quality deterioration by bleeding or the like, the light usage efficiency can be improved.

PRIOR ART DOCUMENTS

Patent Document

[Patent Document 1] Japanese Patent Application Publication No. 2003-229283

SUMMARY OF THE INVENTION

Problem to Be Solved by the Invention

However, in an organic EL display device described in Patent Document 1 as well, there is much light bound within an organic emitting layer, the improved effect of the light usage efficiency is still insufficient. Although the case of an organic EL display device is presented here as an example, the problem of a low light usage efficiency is not restricted to application as a display device, and is common as well to application as an illumination device.

One aspect of the present invention has been made to solve the above-noted problems, and has an object to provide an organic EL device, a production method for an organic EL device, an illumination device, and a display device having a superior light usage efficiency.

Means for Solving the Problems

To achieve the above-described object, an organic EL device according to one aspect of the present invention includes: a base material in which a recess is provided at an upper surface of the base material; a reflective layer that is provided at least along a surface of the recess; a filling layer that is filled into an inside of the recess via the reflective layer, the filling layer having light transmissivity; a first electrode that is provided at least on a layer above the filling layer, the first electrode having light transmissivity; an organic layer that is provided on a layer above the first electrode, the organic layer including at least a light-emitting layer; and a second electrode that is provided on a layer above the organic layer, the second electrode having light transmissivity and light reflectivity, wherein a part of the reflective layer contacts a part of the first electrode.

An organic EL device according to one aspect of the present invention includes: a base material in which a recess is provided at an upper surface of the base material; a reflective layer that is provided at least along a surface of the recess; a filling layer that is filled into an inside of the recess via the reflective layer, the filling layer having light transmissivity; a first electrode that is provided at least on a layer above the filling layer, the first electrode having light transmissivity; an organic layer that is provided on a layer above the first electrode, the organic layer including at least a light-emitting layer; and a second electrode that is provided on a layer above the organic layer, the second electrode having light transmissivity and light reflectivity, wherein a lower surface of the first electrode at a position in the recess is positioned lower than a plane that includes the upper surface of the base material.

In the organic EL device according to one aspect of the present invention, it is preferable that a lower surface of the light-emitting layer at a position in the recess is positioned below a plane that includes the upper surface of the base material.

In the organic EL device according to one aspect of the present invention, the second electrode may be constituted by a metal film.

In the organic EL device according to one aspect of the present invention, a cross-section shape of the recess cut by an arbitrary plane that may be perpendicular to the upper surface of the base material is an arc.

In the EL device according to one aspect of the present invention, it is preferable that the first electrode is provided so as to contact an upper surface of the filling layer, and a refractive index of the filling layer is substantially same as a refractive index of the first electrode.

In the EL device according to one aspect of the present invention, it is preferable that a refractive index of the filling layer is substantially same as a refractive index of the light-emitting layer.

In the EL device according to one aspect of the present invention, the reflective layer may be constituted by a multilayer dielectric film.

In the EL device according to one aspect of the present invention, the reflective layer may have light scattering properties.

The EL device according to one aspect of the present invention may include a plurality of unit light-emitting regions, the recess may include at least a first recess and a second recess having mutually different shapes, and the first recess and second recess may be provided within one unit light-emitting region.

The EL device according to one aspect of the present invention may include a plurality of unit light-emitting regions, the recess may include at least a first recess and a second recess having mutually different shapes, and the plurality of unit light-emitting regions may include at least a first unit light-emitting region having the first recess and a second unit light-emitting region having the second recess.

In the EL device according to one aspect of the present invention, a configuration in which the first unit light-emitting region and the second unit light-emitting region are each driven independently may be adoptted.

A method for manufacturing an organic EL device according to one aspect of the present invention includes: a step of forming a recess at an upper surface of a base material; a step of forming a reflective layer at least along a surface of the recess; a step of forming a filling layer inside the recess via the reflective layer, the filling layer having light transmissivity; a step of forming a first electrode at least on a layer above the filling layer, the first electrode having light transmissivity; a step of forming an organic layer on a layer above the first electrode, the organic layer including at least a light-emitting layer; and a step of forming a second electrode on a layer above the organic layer, the second electrode having light transmissivity and light reflectivity, wherein, in the step of forming the first electrode, the first electrode is formed so that a part of the first electrode contacts a part of the reflective layer.

A method for manufacturing an organic EL device according to one aspect of the present invention includes: a step of forming a recess at an upper surface of a base material; a step of forming a reflective layer at least along a surface of the recess; a step of forming a filling layer inside the recess via the reflective layer, the filling layer having light transmissivity; a step of forming a first electrode at least on a layer above the filling layer, the first electrode having light transmissivity; a step of forming an organic layer on a layer above the first electrode, the organic layer including at least a light-emitting layer; and a step of forming a second electrode on a layer above the organic layer, the second electrode having light transmissivity and light reflectivity, wherein, in the step of forming the first electrode, the first electrode is formed so that a lower surface of the first electrode in a position in the recess is positioned lower than a plane that includes the upper surface of the base material.

An illumination device according to one aspect of the present invention includes: a base material in which a recess is provided at an upper surface of the base material; a reflective layer that is provided at least along a surface of the recess; a filling layer that is filled into an inside of the recess via the reflective layer, the filling layer having light transmissivity; a first electrode that is provided at least on a layer above the filling layer, the first electrode having light transmissivity; an organic layer that is provided on a layer above the first electrode, the organic layer including at least a light-emitting layer; and a second electrode that is provided on a layer above the organic layer, the second electrode having light transmissivity and light reflectivity, wherein a part of the reflective layer contacts a part of the first electrode.

An illumination device according to one aspect of the present invention includes: a base material in which a recess is provided at an upper surface of the base material; a reflective layer that is provided at least along a surface of the recess; a filling layer that is filled into an inside of the recess via the reflective layer, the filling layer having light transmissivity; a first electrode that is provided at least on a layer above the filling layer, the first electrode having light transmissivity; an organic layer that is provided on a layer above the first electrode, the organic layer including at least a light-emitting layer; and a second electrode that is provided on a layer above the organic layer, the second electrode having light transmissivity and light reflectivity, wherein a lower surface of the first electrode at a position in the recess is positioned lower than a plane that includes the upper surface of the base material.

A display device according to one aspect of the present invention includes: a base material in which a recess is provided at an upper surface of the base material; a reflective layer that is provided at least along a surface of the recess; a filling layer that is filled into the inside of the recess via the reflective layer, the filling layer having light transmissivity; a first electrode that is provided at least on a layer above the filling layer, the first electrode having light transmissivity; an organic layer that is provided on a layer above the first electrode, the organic layer including at least a light-emitting layer; and a second electrode that is provided on a layer above the organic layer, the second electrode having light transmissivity and light reflectivity, wherein a part of the reflective layer contacts a part of the first electrode.

A display device according to one aspect of the present invention includes: a base material in which a recess is provided at an upper surface of the base material; a reflective layer that is provided at least along a surface of the recess; a filling layer that is filled into the inside of the recess via the reflective layer, the filling layer having light transmissivity; a first electrode that is provided at least on a layer above the filling layer, the first electrode having light transmissivity; an organic layer that is provided on a layer above the first electrode, the organic layer including at least a light-emitting layer; and a second electrode that is provided on a layer above the organic layer, the second electrode having light transmissivity and light reflectivity, wherein a lower surface of the first electrode at a position in the recess is positioned lower than a plane that includes the upper surface of the base material.

Effect of the Invention

According to one aspect of the present invention, it is possible to embody an organic EL device having superior light usage efficiency. According to one aspect of the present invention, it is possible to embody a production method for an organic electroluminescence device. According to one aspect of the present invention, it is possible to embody an illumination device. According to one aspect of the present invention, it is possible to embody a display device.

BRIEF DESCRIPTIONS OF THE DRAWINGS

FIG. 5(A) to 5(D) are cross-sectional views of a manufacturing process for an organic EL device.

Figure 5:
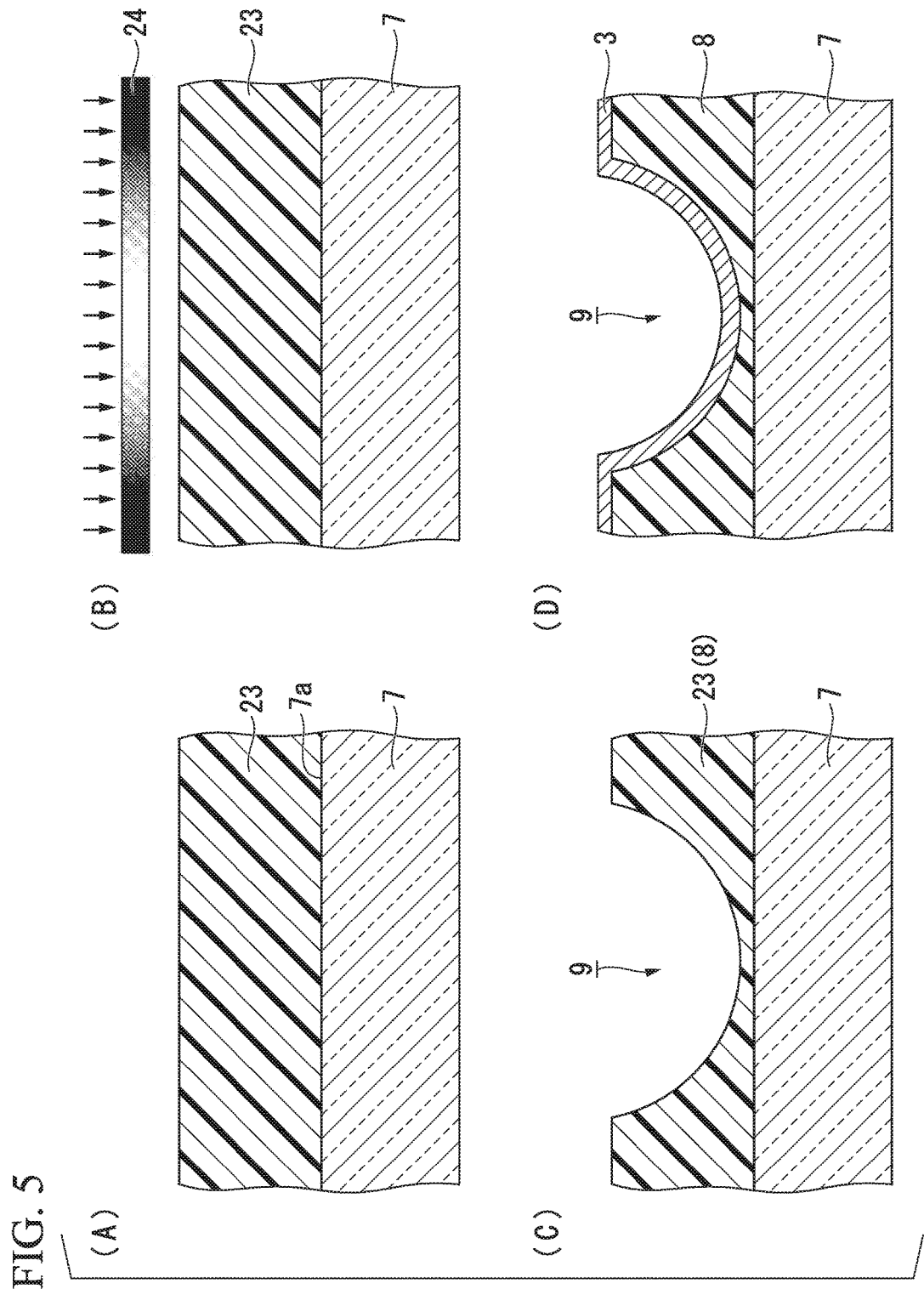
Figure 6:
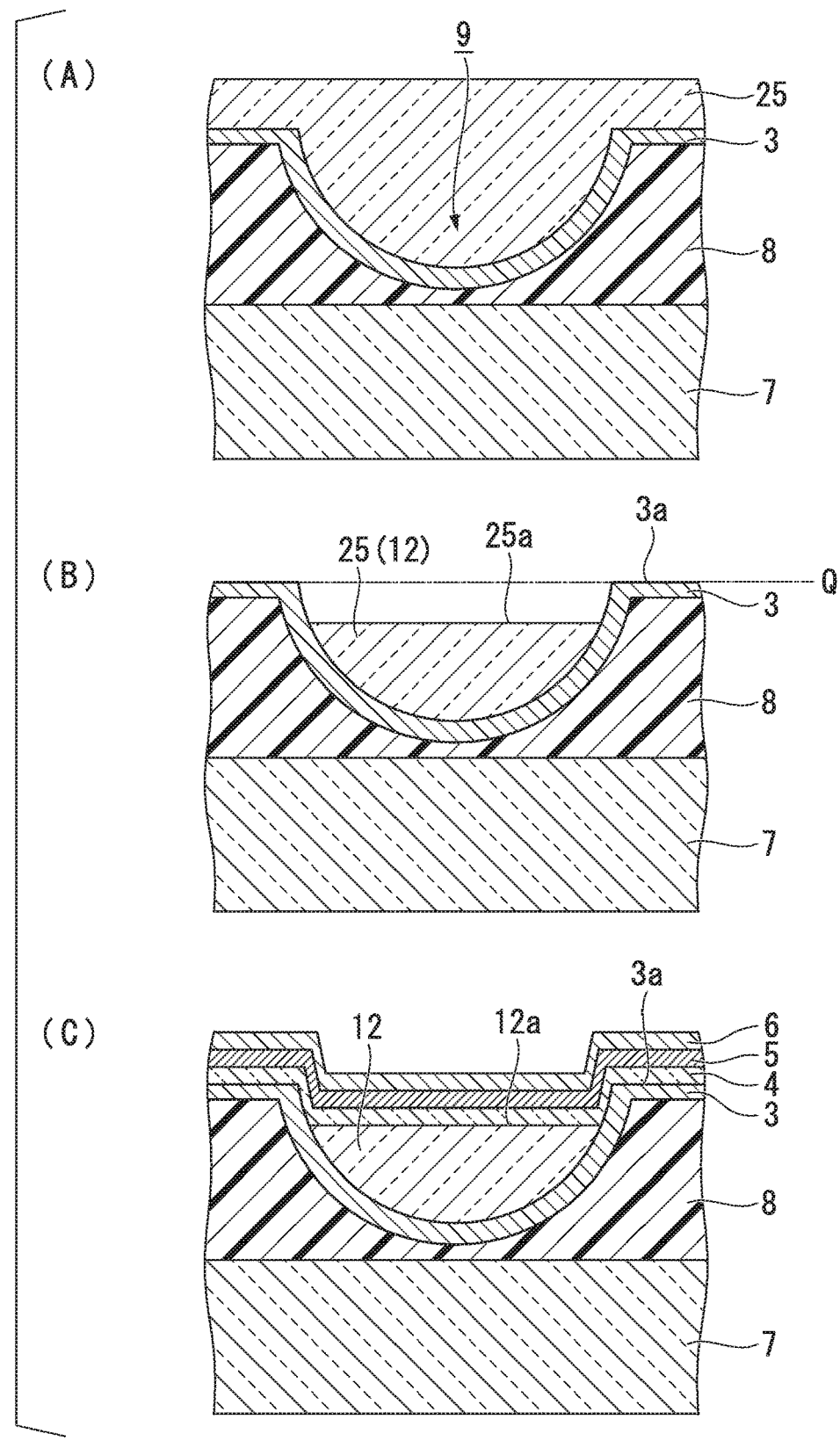
Figure 7:
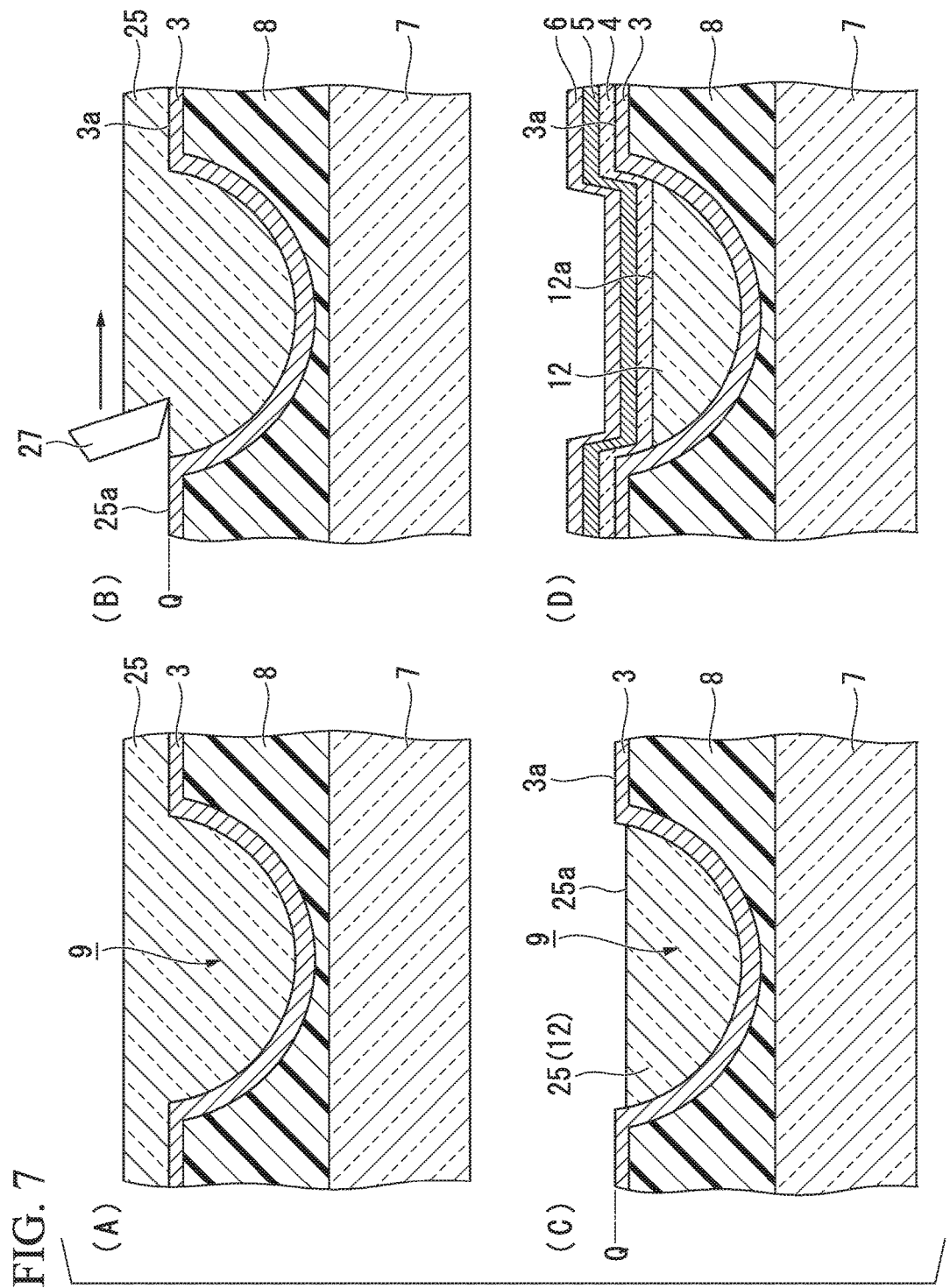

FIG. 6(A) to 6(C) are cross-sectional views showing a first example of a manufacturing process following the manufacturing process shown in FIG. 5.

FIG. 7(A) to 7(D) are cross-sectional views showing a second example of a manufacturing process following the manufacturing process shown in FIG. 5.

Figure 8:
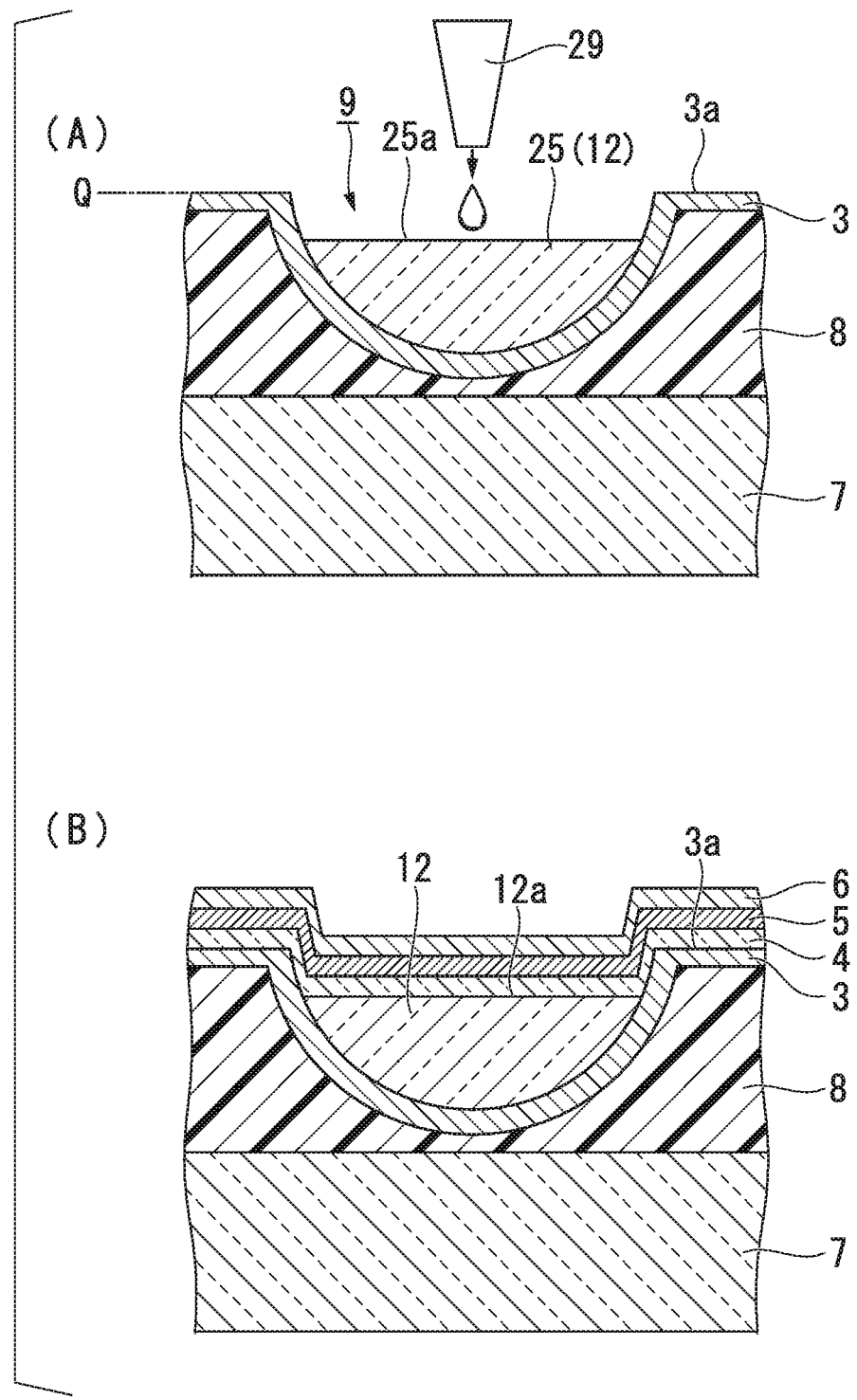

FIG. 8(A) and 8(B) are cross-sectional views showing a third example of a manufacturing process following the manufacturing process shown in FIG. 5.

Figure 9:
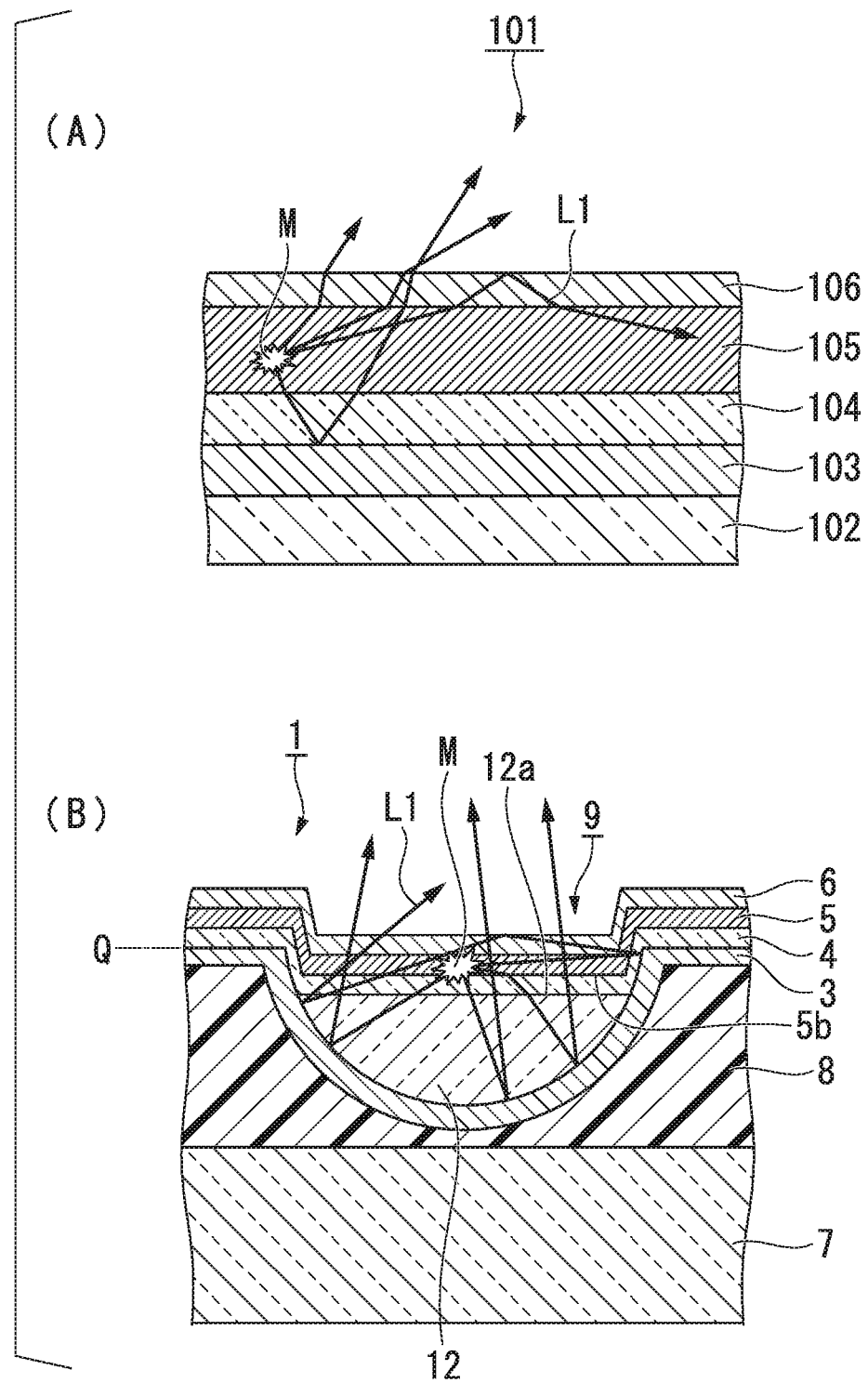

FIG. 9(A) is a cross-sectional view for describing a problem of a conventional organic EL device and FIG. 9(B) is a cross-sectional view for describing the operation of an organic EL device of the present embodiment.

Figure 10:
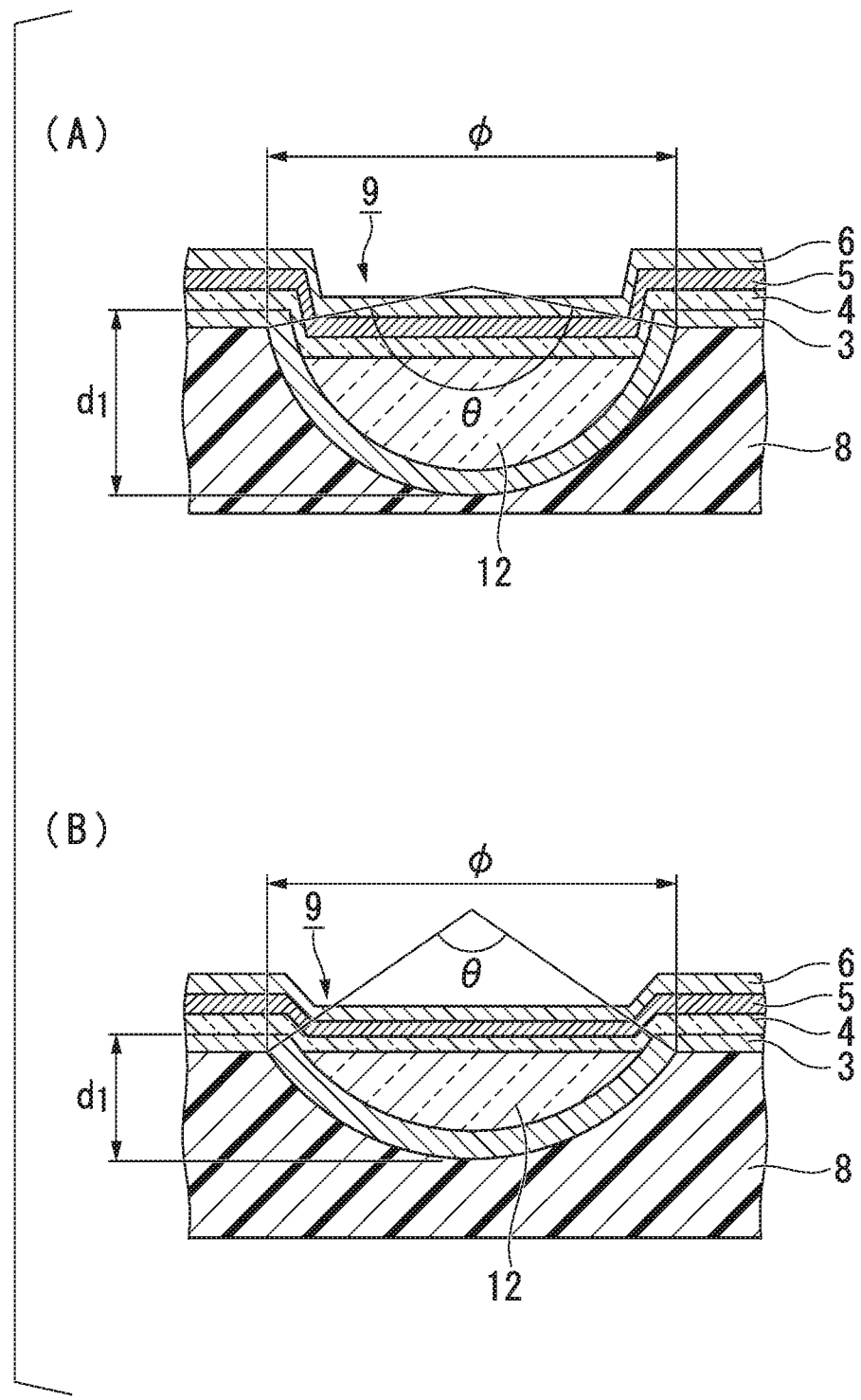

FIG. 10(A) and FIG. 10(B) are drawings for describing parameters indicating the depth of a recess.

Figure 11:
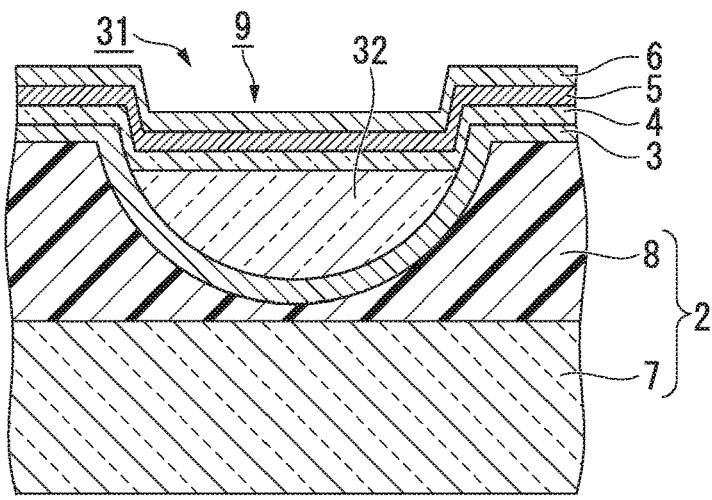

FIG. 11 is a cross-sectional view of an organic EL device of a second embodiment.

Figure 12:
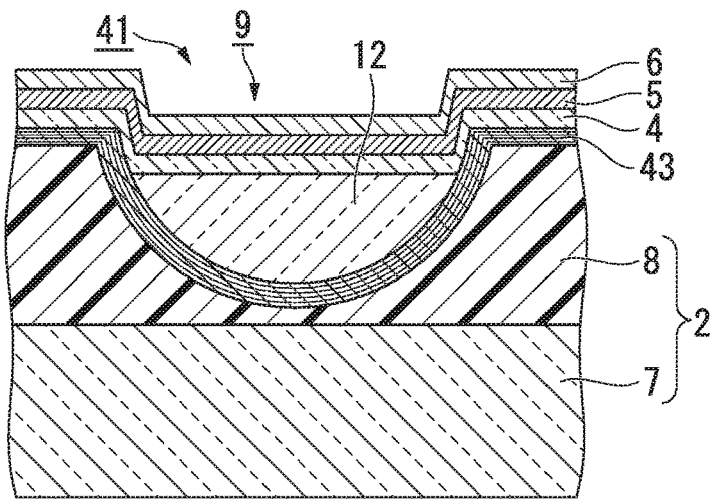

FIG. 12 is a cross-sectional view of an organic EL device of a third embodiment.

Figure 13:
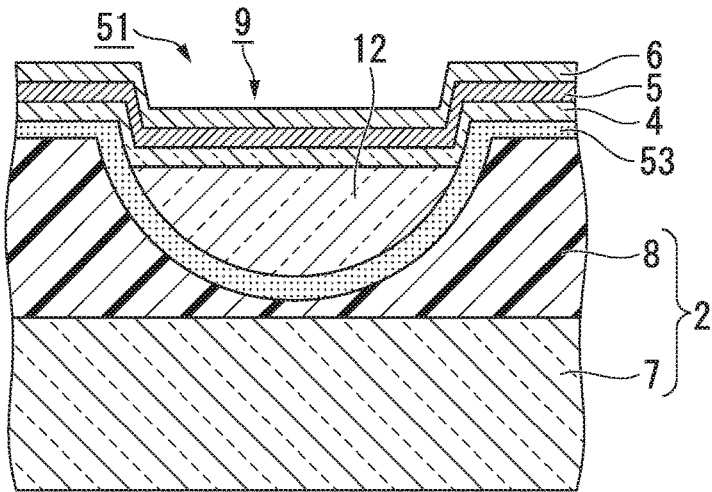

FIG. 13 is a cross-sectional view of an organic EL device of a fourth embodiment.

Figure 14:
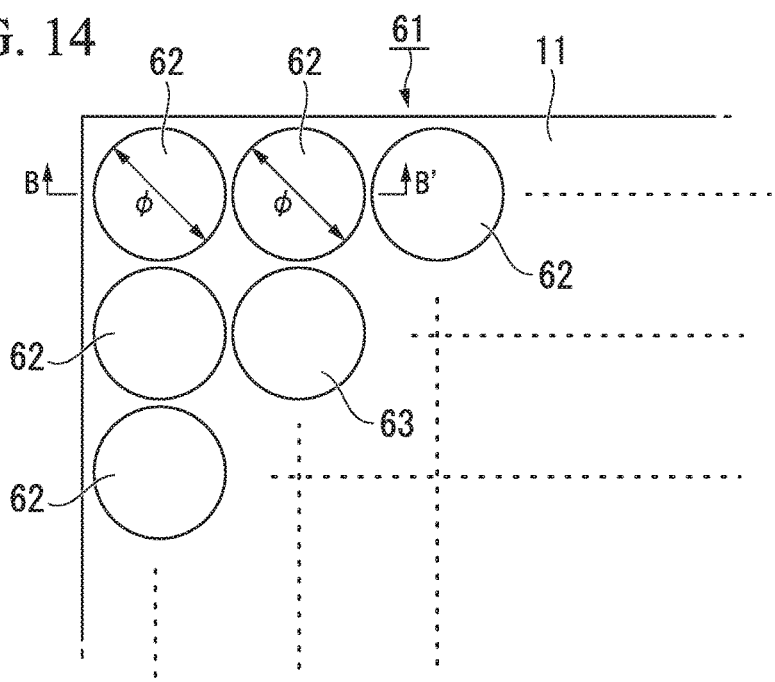

FIG. 14 is a plan view of an organic EL device of a fifth embodiment.

Figure 15:
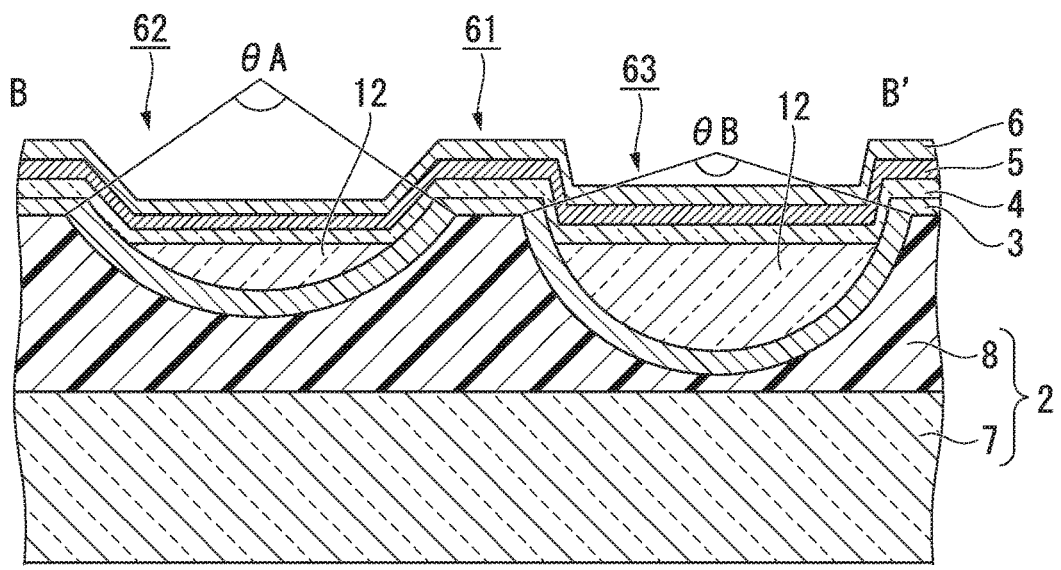

FIG. 15 is a cross-sectional view along the line B-B' of FIG. 14.

Figure 16:
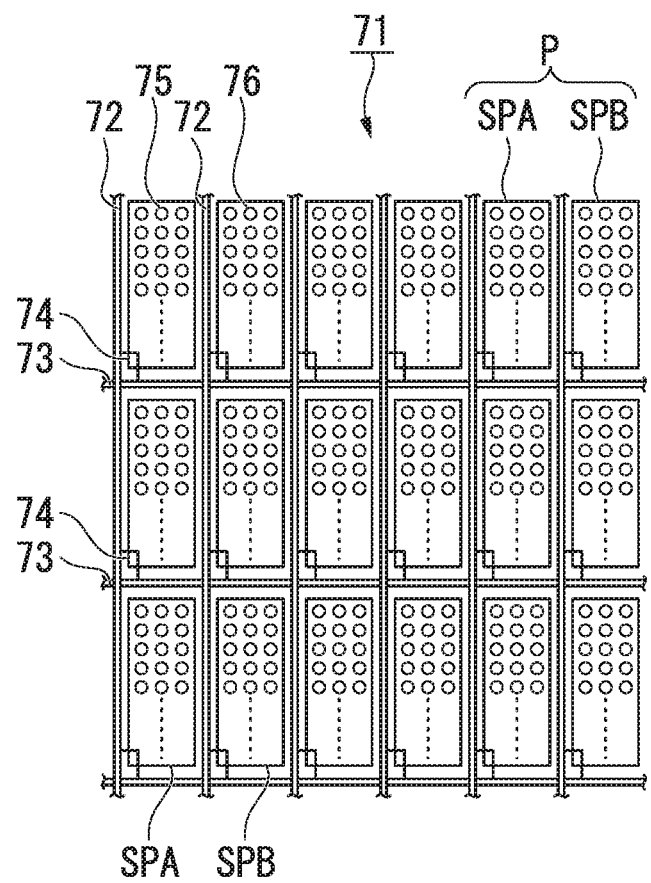

FIG. 16 is a plan view of an organic EL device of a sixth embodiment.

EMBODIMENTS FOR CARRYING OUT THE INVENTION (First Embodiment)

The first embodiment of the present invention will be described below, using FIG. 1 to FIG. 10.

The organic electroluminescence device of the first embodiment is an example of a top-emission type organic EL device that adopts a microcavity structure.

Figure 1:
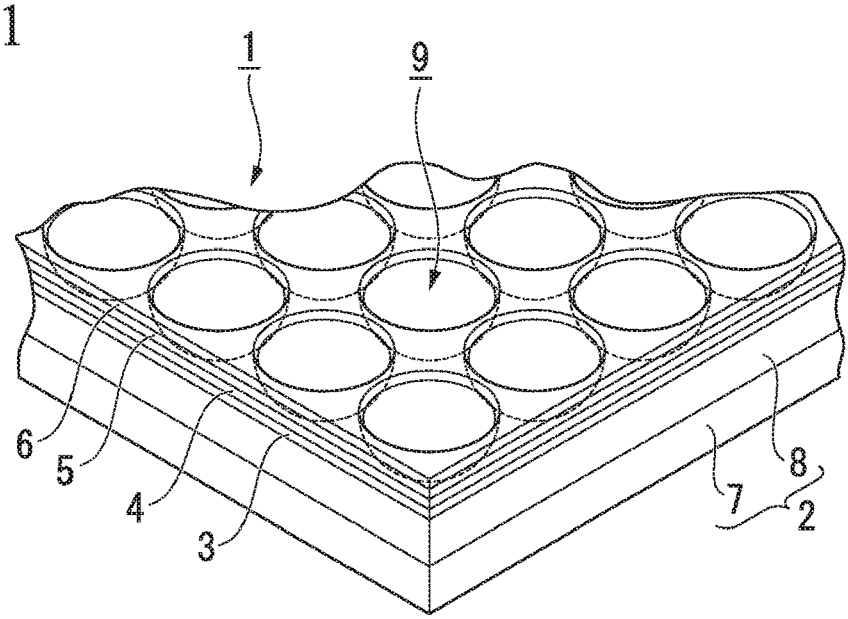
FIG. 1 is an oblique view of an organic EL device of a first embodiment.

FIG. 1 is an oblique view of the organic EL device of the first embodiment.

In the various drawings noted below, as an aid to viewing the constituent elements, some of the constituent elements are shown with different dimensional scale.

As shown in the FIG. 1, the organic EL device 1 of the present embodiment has a base material 2, a reflective layer 3, a first electrode 4, an organic layer 5 that includes a light-emitting layer, and a second electrode 6. The organic EL device 1 is a top-emission type organic EL device, and light shining from the light-emitting layer is radiated from the second electrode 6 side. The base material 2 includes a substrate 7 and an underlayer 8. The underlayer 8, the reflective layer 3, the first electrode 4, the organic layer 5, and the second electrode 6 are laminated on the upper surface of the substrate 7 in sequence from the substrate 7 side. A plurality of recesses 9 are provided in the upper surface (light-emitting surface) of the organic EL device 1.

The organic EL device 1 has a plurality of mutually divided unit light-emitting regions 11. The plurality of unit light-emitting regions include a red light-emitting region emitting red light, a green light-emitting region emitting green light, and a blue light-emitting region emitting blue light. The red light-emitting region, the green light-emitting region, and the blue light-emitting region are only different regarding the constituent material of the light-limiting layer, the other constituent elements thereof being in common. The organic EL device 1, for example, can be used as an illumination device that generates white light by emitting red light, green light and blue light simultaneously. However, the application of the organic EL device 1 is not restricted to an illumination device. For example, the red light-emitting region, the green light-emitting region, and the blue light-emitting region are made a red subpixel, a green subpixel and blue subpixel respectively, and the organic EL device 1 can be applied to a display device in which these three subpixels constitute one pixel.

Figure 2:
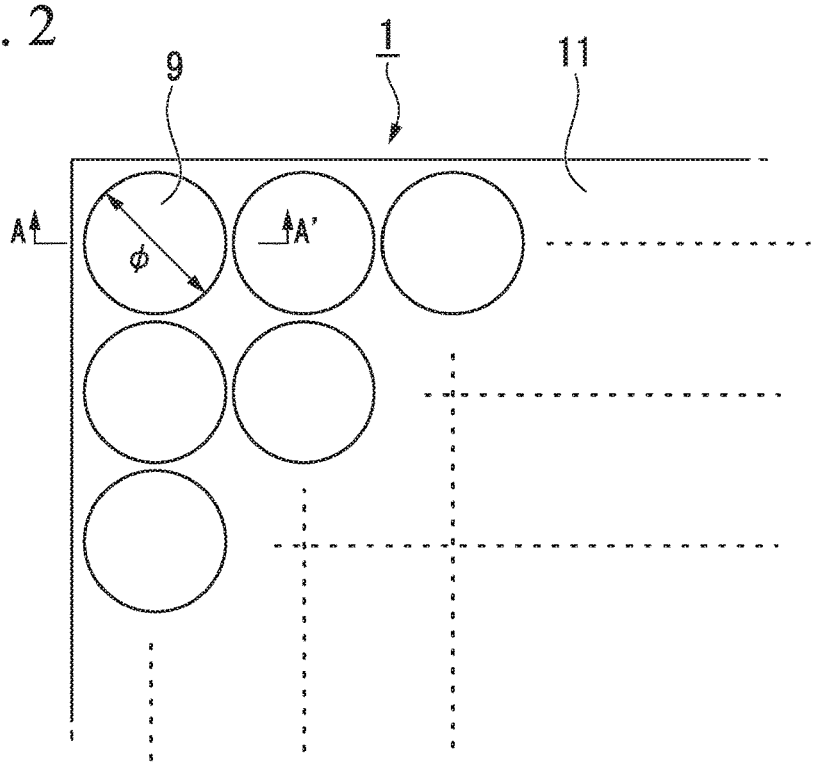
FIG. 2 is a plan view of the organic EL device.

FIG. 2 is an enlarged plan view showing a part of a unit light-emitting region 11.

Seen from the normal direction to the upper surface of the organic EL device 1, the planar shape of a unit light-emitting region 11 is a square, the length of one side of the square being approximately 2 mm As shown in the FIG. 2, a plurality of recesses 9 having circular planar shapes are provided in the unit light-emitting region 11. The diameter $\phi$ of a recess 9 is, for example, approximately 5 μm. The plurality of recesses 9 are arranged regularly vertically and horizontally, forming a matrix arrangement. The density of the recesses 9 is such that the total surface area of the plurality of recesses 9 occupies approximately 70% of the surface area of the unit light-emitting region 11.

Figure 3:
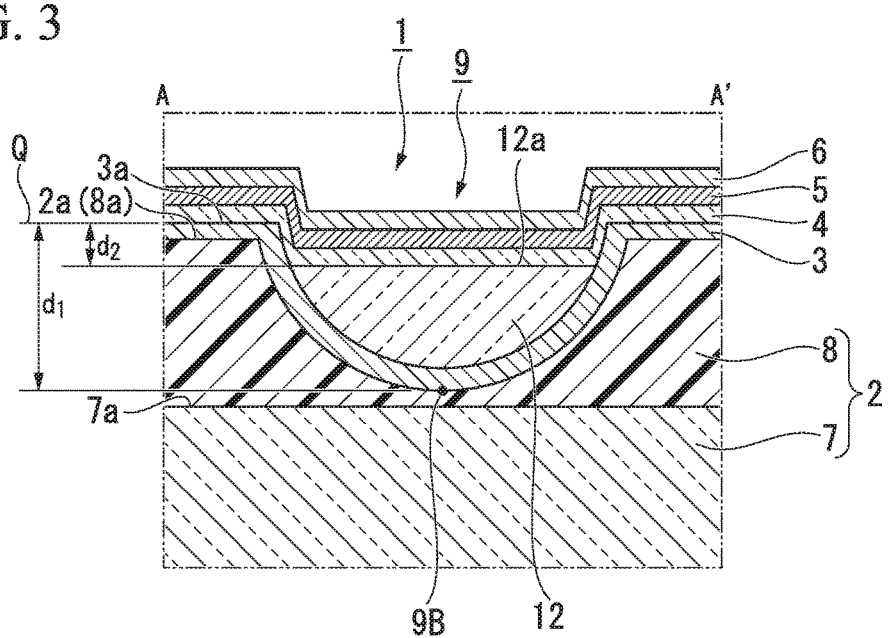
FIG. 3 is a cross-sectional view along the line A-A' of FIG. 2.

FIG. 3 is a cross-sectional view of the organic EL device 1 cut by an arbitrary plane that is perpendicular to the upper surface of the base material 2 along the line A-A of FIG. 2.

As shown in the FIG. 3, the underlayer 8 is laminated onto the upper surface 7a of the substrate 7. A glass substrate, for example, is used as the substrate 7. Because the organic EL device 1 is a top-emission type organic EL device, the substrate 7 need not have light transmissivity, and a semiconductor substrate such as a silicon substrate may be used.

A recess 9 that opens toward the top part is provided in the upper surface 8a of the underlayer 8 or, stated differently, in the upper surface 2a of the base material 2. The cross-sectional shape of the recess 9 is a circular arc. That is, inner the surface of the recess 9 forms a part of a three-dimensional spherical surface. The underlayer 8 is constituted by a photosensitive resin, for example, by a resin such as an acrylic, a polyimide, or the like. The use of a photosensitive resin as the material of the underlayer 8 is preferable for the method of molding the recess 9, which will be described later. However, if a method of molding other than the method described later is used, the material constituting the underlayer 8 need not have photosensitivity. Additionally, the constituent material of the underlayer 8 need not be a resin, and an inorganic material may be used. Although a base material 2 constituted by the substrate 7 and the underlayer 8 is used in the present embodiment, it is not necessary to use an underlayer, and a recess may be formed in the substrate itself.

The reflective layer 3 is formed on the upper surface 8a of the underlayer 8 that includes the inner surface of the recess 9. A metal having a high reflectivity, such as aluminum or silver, is preferably used as a constituent material of the reflective layer 3. In the case of the present embodiment, the reflective layer 3 is constituted by, for example, an aluminum film having a film thickness of 100 nm.

The filling layer 12 is filled on the inside of the recess 9, with the reflective layer 3 therebetween. The upper surface 12a of the filling layer 12 is at a position that is lower than the plane Q that includes the upper surface 3a of the reflective layer 3. The height from the upper surface 12a of the filling layer 12 to the upper surface 3a of the reflective layer 3 is d2, which in the present embodiment, for example, is set to 0.1 µm. The height from the lowermost base 9B of the recess 9 to the upper surface 3a of the reflective layer 3 is d1. Specific examples of the height d1 will be described later.

Although the upper surface 12a of the filling layer 12 is preferably at a position lower than the plane Q that includes the upper surface 3a of the reflective layer 3, even if the upper surface 12a of the filling layer 12 is at the highest position, it is necessary to be at the same height as the plane Q. Stated conversely, the filling layer 12 is not formed so as to be built upward to above the plane Q. The filling layer 12 is constituted of a resin that has light transmissivity. Specifically, the material used for the filling layer 12 is a resin such as an acrylic, an epoxy, or a polyimide. The refractive index of the filling layer 12 in the present embodiment is, for example, 1.5.

The first electrode 4 is formed over the upper surface 12a of the filling layer 12 and the upper surface 3a of the reflective layer 3. The first electrode 4 has a step at the edge part of the recess 9. Of the first electrode 4, the part positioned over the upper surface 8a of the underlayer 8 contacts a part of the reflective layer 3. At a position on the inside of the recess 9, the lower surface of the first electrode 4 contacts the upper surface 12a of the filling layer 12. Therefore, the lower surface of the first electrode 4 is at a position lower than the plane Q that includes the upper surface 3a of the reflective layer 3. The first electrode 4 is a transparent electrode constituted by, for example, a film laminate of a transparent conductive film of indium tin oxide (ITO), indium zinc oxide (IZO) or the like and a metal thin film, and has light transmissivity and light reflectivity. In the case of the present embodiment, the first electrode 4 is constituted, for example, by ITO of a film thickness of 120 nm and by a metal film, such as Al, Ag or the like. Alternatively, the first electrode 4 may be constituted by a metal thin film only. The first electrode 4 functions as an anode for injecting holes into the organic layer.

The organic layer 5 is laminated along the upper surface of the first electrode 4. The organic layer 5 reflects the shape of the first electrode 4 and has a step at the edge part of the recess 9. The organic layer 5 is a laminate made from an organic material including a hole injection layer, a hole transport layer, a light-emitting layer, an electron transport layer, and an electron injection layer. The lower surface of the organic layer 5 is at a position that is lower than the plane Q that includes the upper surface 3a of the reflective layer 3. The details of the constitution and functions of the layers that constitute the organic layer 5 will be described later.

The second electrode 6 is laminated along the upper surface of the organic layer 5. The second electrode 6 reflects the shape of the organic layer 5 and has a step at the edge part of the recess 9. The second electrode 6 is a translucent electrode constituted by a metal thin film of, for example, silver, or a magnesium silver alloy. That is, the second electrode 6 has both light transmissivity and light reflectivity, transmitting a part of incident light and reflecting the remainder. The second electrode 6 preferably uses a metal having a small work function, for example Ag, Al, a magnesium alloy (MgAg or the like), or an aluminum alloy (AlLi, AlCa, AlMg, or the like). In the case of the present embodiment, the second electrode 6 is a film laminate of a MgAg alloy of film thickness 1 nm and Ag of film thickness 19 nm. The second electrode 6 functions as a cathode for injecting electrons into the organic layer 5.

In the present embodiment, the region sandwiched between the first electrode 4 and the second electrode 6 forms the microcavity structure. The light emitted from the light-emitting layer is multiply reflected between the first electrode 4 and the second electrode 6. When this occurs, of the light emitted from the light-emitting layer, a component of a specific wavelength is strengthened. Although it is not illustrated in FIG. 3, an optical adjustment layer called the cap layer is laminated on the upper surface of the second electrode 6.

Figure 4:
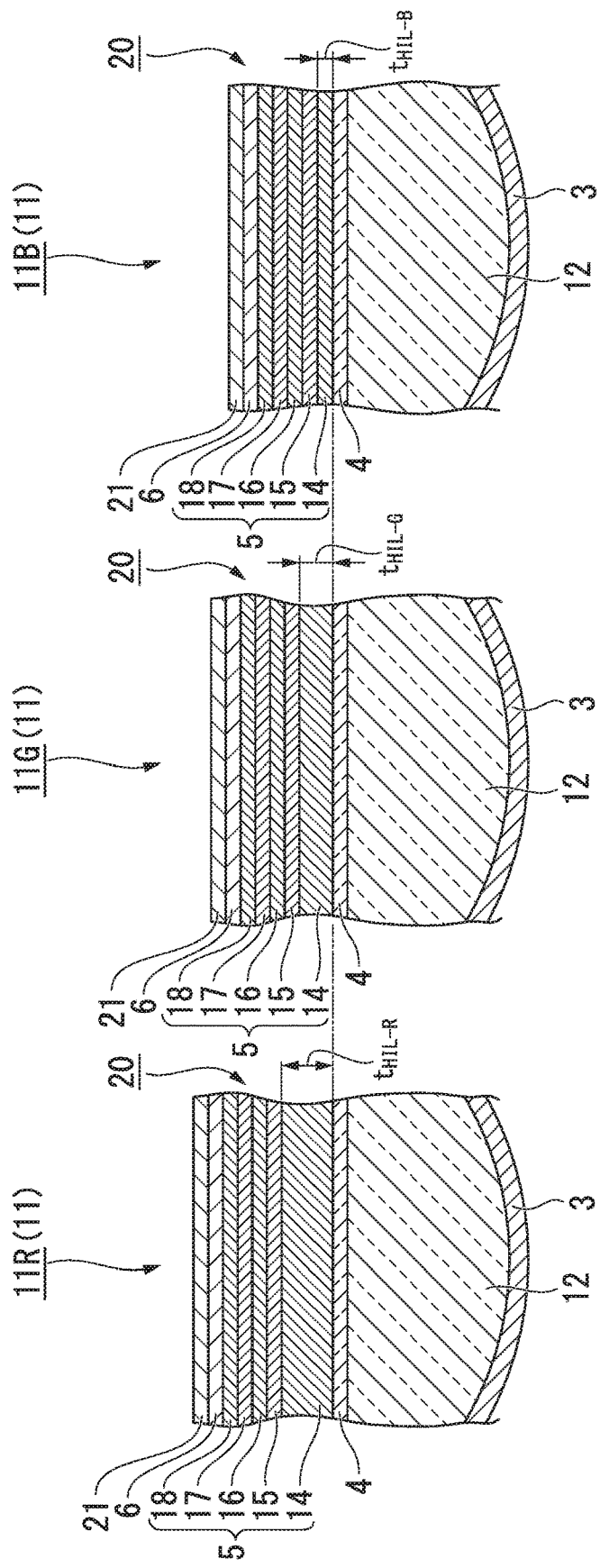
FIG. 4 shows cross-sectional views of the detailed constitution of each unit light-emitting region of each color.

FIG. 4 is a cross-sectional view showing the detailed constitution at each unit light-emitting region 11.

Three unit light-emitting regions 11R, 11G and 11B shown in FIG. 4 are only different in film thicknesses of a hole injection layer, and the basic construction are in common.

As shown in the FIG. 4, the organic layer 5 is provided on a layer above the first electrode 4. The organic layer 5 is constituted by a film laminate in which the hole injection layer 14, the hole transport layer 15, the light-emitting layer 16, the electron transport layer 17, and the electron injection layer 18 are laminated from the first electrode 4 side. However, except for the light-emitting layer 16, insertion may be appropriately done as necessary. Also, a single layer may serve as both a transport layer and an injection layer. In the present embodiment, as described above, the example shown is an organic layer with a five-layer structure of the hole injection layer 14, the hole transport layer 15, the light-emitting layer 16, the electron transport layer 17, and the electron injection layer 18. Additionally, as necessary, a layer such as a hole blocking layer or an electron blocking layer may be added appropriately to block the movement of an electrical charge to the opposite-side electrode.

The hole injection layer 14 has the function of increasing the efficiency of injection of holes into the light-emitting layer 16 from the first electrode 4. Materials used for the hole injection layer 14, for example, are benzine, stearylamine, triphenylamine, porphyrin, triazole, imidazole, oxadiazole, polyaryl alcane, phenylenediamine, aryl amine, oxazole, anthracene, fluorenone, hydrazone, stilbene, triphenylene, azatriphenylene, or a derivative thereof, or a heterocylic conjugate-based monomer, oligomer, polymer, or the like of polysilane-based compound, a vinylcarbazole-based compound, a thiophene-based compound, or an aniline-based compound, with a molybden oxide mixed into these organic materials. The mixture proportion between the organic material and the molybden oxide is, for example, approximately 80% organic material and approximately 20% molybden oxide.

The hole transport layer 15 has the function of increasing the efficiency of hole transport from the first electrode 4 to the light-emitting layer 16. The same type of organic material as the hole injection layer 14 is used in the hole transport layer 15. The hole injection layer 14 and the hole transport layer 15 may be made as one, or may be formed as independent layers.

The light-emitting layer 16 has the function of recombining holes injected from the first electrode 4 side and electrons injected from the second electrode 6 side and emitting light when energy is deactivated. The material of the light-emitting layer 16 is constituted by, for example, a host material and a dopant material. An assist material may also be included. The host material is included with a ratio that is the highest among the constituent materials within the light-emitting layer 16. For example, the mixing proportions of the host material and the dopant material are approximately 90% host material and approximately 10% dopant material. The host material has the function of facilitating film growth of the light-emitting layer 16 and maintaining the light-emitting layer 16 in the condition of a film. It is therefore desired that the host material be a stable compound that resists crystallization and chemical change after film growth. When an electrical field is applied between the first electrode 4 and the second electrode 6, it also has the function, when carriers are recombined within host molecules, of moving excitation energy in the dopant material and causing the dopant material to emit light. The thickness of the light-emitting layer 16 is, for example, approximately 60 nm.

The specific materials of the light-emitting layer 16 include a material having a high light-emitting efficiency, such as a low molecular weight fluorescent dye, a fluorescent polymer or metal complex. Materials of the light-emitting layer 16 that can be cited include anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene or a derivative thereof, tris (8-quinolinato) aluminum complex, bis (benzoquinolinato) beryllium complex, tri (dibenzoylmethyl) phenanthroline europium complex, and di-tolyl vinylbiphenyl or the like.

The electron transport layer 17 has a function of increasing the electron transport efficiency from the second electrode 6 to the light-emitting layer 16. Materials of that can be used as the material of the electron transport layer 17 include, for example, quinoline, perylene, phenanthroline, bis(styryl), pyrazine, triazole, oxazole, oxadiazole, fluorenone, or a derivative or metal complex of these. Specifically, tris (8-hydroxyquinoline) aluminum, anthracene, naphthalene, phenanthrene, pyrene, anthracene, perylene, butadiene, coumarin, acridine, stilbene, 1,10-phenanthrorine, or a derivative or metal complex of these. The thickness of the electron transport layer 17 is, for example, approximately 15 nm.

The electron injection layer 18 has the function of increasing the efficiency of injecting electrons from the second electrode 6 to the light-emitting layer 16. The material used for the electron injection layer 18 is, for example, metallic calcium (Ca), or a compound such as lithium fluoride (LiF). The electron transport layer 17 and the electron injection layer 18 may be made as one, or may be formed as independent layers. The thickness of the electron injection layer 18 is, for example, approximately 0.5 nm.

The microcavity structure 20 has the effect of strengthening light at a specific wavelength, by using the resonance of light occurring between the first electrode 4 and the second electrode 6. In the case of the present embodiment, the wavelength of the light emitted from each of the red, green and blue unit light-emitting regions 11R, 11G and 11B is different respectively. For that reason, the length of the light path between the first electrode 4 and the second electrode 6 thus corresponds to the light emission spectral peak wavelength of each color. The lengths of the light paths are set respectively so that the light path of the red unit light-emitting region 11R is longest, the light path of the blue unit light-emitting region 11B is shortest, and the light path of the green unit light-emitting region 11G is an intermediate length therebetween.

Although there are various methods of making the light path length of the microcavity structure 20 of each of the unit light-emitting regions 11R, 11G, and 11B different, in this case, from the standpoint of suppressing the resistance value as much as possible, the method of making the thickness of the hole injection layer 14 different is adopted. If the thickness of the hole injection layer 14 of the red unit light-emitting region 11R is taken to be $t_{HIL-R}$, the layer thickness of the hole injection layer 14 of the green unit light-emitting region 11G is taken to be $t_{HIL-G}$, and the layer thickness of the hole injection layer 14 of the blue unit light-emitting region 11B is taken to be $t_{HIL-B}$, then $t_{HIL-R} > t_{HIL-G} > t_{HIL-B}$.

By the microcavity structure 20, the light emitted from the organic layer 5 repeats reflections within a prescribed optical length between the first electrode 4 and the second electrode 6, with resonance and strengthening of light of the specific wavelength corresponding to the light path length and light of wavelengths not corresponding to the light path length being weakened. Thus, the spectrum of light extracted to the outside is sharp and is of high intensity, thereby improving the luminance and color purity.

Regarding the constituent material of the light-emitting layer 16, a light-emitting material that emits red light may be used for the red unit light-emitting region 11R, a light-emitting material that emits green light may be used for the green unit light-emitting region 11G, and a light-emitting material that emits blue light may be used for the blue unit light-emitting region 11B. In the present embodiment, bipolar material is used as the host material in all the unit light-emitting regions. As the dopant material, a phosphorescent material is used in the red unit light-emitting regions 11R and the green unit light-emitting regions 11G, and a fluorescent material is used in the blue unit light-emitting regions 11B. The thickness of the light-emitting layer 16 is, for example, approximate 60 nm in the red unit light-emitting regions 11R and the green unit light-emitting regions 11G, and is, for example, approximate 35 nm in the blue unit light-emitting regions 11B.

Alternatively, the same light-emitting material that emits white light may be used in all of the red unit light-emitting region 11R, the green unit light-emitting region 11G, and the blue unit light-emitting region 11B. In this case as well, as a result of the resonance and amplifying of light with different wavelengths from each unit light-emitting region 11R, 11G, and 11B, red light is emitted from the red unit light-emitting region 11R, green light is emitted from the green unit light-emitting region 11G, and blue light is emitted from the blue unit light-emitting region 11B.

The cap layer 21 is laminated on the upper surface of the second electrode 6. The cap layer 21 functions as a protective layer that protects the second electrode 6 and also functions as an optical adjustment layer. A color filer may be added on a layer above the second electrode 6. By the light emitted from the organic layer 5 passing through the color filter, it is possible to increase the color purity.

A specific example of the constitution of the organic EL device 1 is as shown in Table 1.

TABLE 1

|  | Red unit light-emitting region | Green unit light-emitting region | Blue unit light-emitting region |
| --- | --- | --- | --- |
| Anode | ITO: 120 nm | ITO: 120 nm | ITO: 120 nm |
| Hole injection layer | Organic HTL material (80%):MoOx (20%) 130 nm | Organic HTL material (80%):MoOx (20%) 70 nm | Organic HTL material (80%):MoOx (20%) 35 nm |
| Hole transport layer | Organic HTL material 10 nm | Organic HTL material 10 nm | Organic HTL material 10 nm |
| Light-emitting layer | H (90%):d (10%) 60 nm H: Bipolar material d: Phosphorescent material | H (90%):d (10%) 60 nm H: Bipolar material d: Phosphorescent material | H (90%):d (10%) 35 nm H: Bipolar material d: Fluorescent material |
| Electron transport layer | Organic ETL material 15 nm | Organic ETL material 15 nm | Organic ETL material 15 nm |
| Electron injection layer | LiF 0.5 nm | LiF 0.5 nm | LiF 0.5 nm |
| Cathode | MgAg 1 nm/Ag 19 nm | MgAg 1 nm/Ag 19 nm | MgAg 1 nm/Ag 19 nm |
| Cap layer | 78 nm | 78 nm | 78 nm |

Light-emitting layer H (host material), d (dopant material)

The manufacturing process for the above-noted organic EL device 1 is described below, using FIG. 5 to FIG. 8.

First, as shown in FIG. 5(A), a positive-type photosensitive resin material is coated onto the upper surface 7a of the substrate 7 to form the resin layer 23.

Next, as shown in FIG. 5(B), the resin layer 23 is exposed via a photomask 24. When this is done, the photomask 24 that has a prescribed light-transmission amount distribution, such as a gray tone mask, is used. Specifically, the photomask 24 is such that the light transmission amount is large at the near the center of a circular pattern and the light transmission amount decreases with movement toward the peripheral part. By doing this, in the resin layer 23, the exposure amount is large near the center of the circular pattern and the exposure amount decreases moving toward the peripheral part.

Next, as shown in FIG. 5(C), the resin layer 23 is developed using a prescribed developer. When this is done, depending upon the difference in the exposure amount of the resin layer 23, the amount of film reduction of the resin layer 23 is large near the center of a circular pattern and becomes smaller moving toward the peripheral part. This forms a recess 9 with an arc-shaped cross-section in the resin layer 23 and forms the underlayer 8.

Next, as shown in FIG. 5(D), a metal such as aluminum is deposited over the entire surface of the underlayer 8, thereby forming the reflective layer 3.

Next, three methods of forming the filling layer 12 can be cited as examples.

These methods of forming the filling layer 12 are described below.

The first filling layer forming method is as follows.

First, as shown in FIG. 6(A), a resin film 25 made of acrylic, epoxy, polyimide or the like is formed over the entire surface of the reflective layer 3. The method of forming the resin film 25 is, for example, a method such as using spin-coating or bar-coating to coat a liquid resin material onto the reflective layer 3. When this is done, the thickness of the resin film 25 is set so that the resin film 25 fills the recess 9 and also covers the flat part of the reflective layer 3.

Next, as shown in FIG. 6(B), using the method, for example, of plasma ashing (dry ashing) or the like, the entire surface of the resin film 25 is etched back. When this is done, the etch back amount is adjusted so that the upper surface 25a of the resin film 25 reaches to a position below the plane Q that includes the upper surface 3a of the reflective layer 3. This forms the filling layer 12.

Next, as shown in FIG. 6(C), the first electrode 4, the organic layer 5, and the second electrode 6 are sequentially formed on the upper surface 3a of the reflective layer 3 and on the upper surface 12a of the filling layer 12. The first electrode 4, the organic layer 5, and the second electrode 6 are formed by known processes. For example, patterning may be formed using vacuum deposition that uses a shadow mask, although this is not a restriction, and the spray method, the injection method, the printing method, or the laser transfer method or the like can be used.

The second filling layer forming method is as follows.

As shown in the FIG. 7(A), a resin film 25 made of acrylic, epoxy, polyimide or the like is formed over the entire surface of the reflective layer 3. This process step is the same as in the first filling layer formation method shown in FIG. 6(A).

Next, as shown in FIG. 7(B), a squeegee 27 is used to planarize the entire surface of the resin film 25. When this is done, the squeegee 27 is moved along the upper surface 3a of the reflective layer 3 so that the upper surface 25a of the resin film 25 after the passage of the squeegee 27 is on the same plane as the plane Q that includes the upper surface 3a of the reflective layer 3.

Next, as shown in FIG. 7(C), the base material on which the resin film 25 remains in the recess 9 is baked. As a result of baking, the volume of the resin film 25 shrinks, and the upper surface 25a of the resin film 25 is at a position lower than the plane Q that includes the upper surface 3a of the reflective layer 3. This forms the filling layer 12.

Next, as shown in FIG. 7(D), the first electrode 4, the organic layer 5, and the second electrode 6 are sequentially formed on the upper surface 3a of the reflective layer 3 and on upper surface 12a of the filling layer 12. This process step is the same as the first filling layer forming method shown in FIG. 6(C).

The third filling layer formation method is as follows.

As shown in the FIG. 8(A), a resin film 25 made of acrylic, epoxy, polyimide, or the like is laminated onto the surface of the reflective layer 3 that corresponds to the inside of the recess 9. The method used to form the resin film 25 is, for example, to use the inkjet method to coat a liquid resin material onto the reflective layer 3. When this is done, the amount of resin material ejected from the inkjet head 29 is adjusted so that the upper surface 25a of the resin film 25 is at a position lower than the plane Q including the upper surface 3a of the reflective layer 3. This forms the filling layer 12.

Next, as shown in FIG. 8(B), the first electrode 4, the organic layer 5, and the second electrode 6 are sequentially formed on the upper surface 3a of the reflective layer 3 and on the upper surface 12a of the filling layer 12. This process step is the same as the first filling layer forming method shown in FIG. 6(C).

The above process finishes the organic EL device 1 of the present embodiment.

FIG. 9(A) is a cross-sectional view showing a conventional organic EL device 101.

The organic EL device 101 is constituted by the sequential lamination of a reflective layer 103, a first electrode 104, an organic layer 105, and a second electrode 106 onto a substrate 102. In the organic EL device 101, light emitted from a light-emitting layer in the organic layer 105 is emitted uniformly in all directions, and proceeds internally as it is refracted at the boundaries between each of the layers that have different refractive indexes. The light that has progressed through the substrate 102 is reflected by the reflective layer 103.

Because there is a difference in the refractive index at the boundary between the second electrode 106 and the external space (air), light that strikes this boundary at a small angle of incidence is emitted to the external space, and light that strikes at a large angle of incidence is reflected at the boundary and proceeds again internally. For example, it is difficult for the light L1 emitted at a direction close to straight sideways from an arbitrary light-emitting point M within the organic layer 105 to exit to the external space, even if it is refracted at an interlayer boundary and the angle changes somewhat.

In the path travelled by light within the organic EL device 101, no loss occurs by reflection of light at the boundary between the second electrode 106 and the external space (air). In contrast, at the boundary between the first electrode 104 and the reflective layer 103, because the reflectivity of the metal that constitutes the reflective layer 103 is generally not 100%, loss occurs because of the light reflection. Additionally, a part of the light is absorbed by various layers as it progresses through the inside of the organic EL device 101. Therefore, the light is attenuated as it progresses through the inside of the organic EL device 101. The refractive index of the organic layer 105 is usually approximately 1.8, in which case, of the light emitted from the light-emitting layer, a proportion of light of approximately 20% is extracted to the external space. In this manner, the conventional organic EL device 101 has a problem of a low light usage efficiency.

In contrast, in the organic EL device 1 of the present embodiment, as shown in FIG. 9(B), the reflective layer 3 is curved along the recess 9. For that reason, the direction of travel of light that is reflected at the reflective layer 3 is changed, and it progresses through the inside of the organic EL device 1. When this occurs, even if there would have been a large angle of incidence with respect to the boundary between the second electrode 6 and the external space (air), light that has been converted by reflection at the reflective layer 3 to an angle of incidence smaller than the critical angle at the boundary between the second electrode 6 and the external space is extracted to the external space.

In the case of the present embodiment in particular, as described above, the upper surface 12a of the filling layer 12 is at a position lower than the plane Q that includes the upper surface 3a of the reflective layer 3 and also the lower surface 5b of the organic layer 5 is at a position lower than the plane Q. That is, the reflective layer 3 exists on the sides (left and right directions in FIG. 9(B)) of the organic layer 5 in the inside of the recess 9. For that reason, for example, the light L1 emitted in a direction close to straight sideways from an arbitrary light-emitting point M within the organic layer 5 is reflected at the reflective layer 3 and the angle of the direction of its travel changes. Thus, in contrast to the conventional organic EL device 101 shown in FIG. 9(A), even for the light L1 emitted in a direction close to straight sideways from the light-emitting point M, after reflection at the reflective layer 3, when the light strikes the boundary between the second electrode 6 and the external space at an angle of incidence smaller than the critical angle, it can be extracted to the external space. Doing this enables the provision of an organic EL device 1 having superior light usage efficiency.

In the present embodiment, because the upper surface 12a of the filling layer 12 is at a position lower than the plane Q and also the lower surface 5b of the organic layer 5 is at a position lower than the plane Q, even light emitted substantially straight sideways from the light-emitting point M in the organic layer 5 can strike the reflective layer 3. However, were the upper surface 12a of the filling layer 12 to be one the same plane as the plane Q, the lower surface 5b of the organic layer 5 would be at a position higher than the plane Q. In such a case, because the reflective layer 3 does not exist on the sides of the organic layer 5 positioned on the inside of the recess 9, light emitted substantially straight sideways from the light-emitting point M inside the organic layer 5 would not strike the reflective layer 3. Even in that case, however, compared with the conventional organic EL device 101, the proportion of light emitted within a prescribed angle range near straight sideways from the light-emitting point M in the organic layer 5 that strikes the reflective layer 3 is sufficiently increased. Therefore, even with this constitution, an organic EL device with superior light usage efficiency can be provided.

To verify the effect of the organic EL device 1 of the present embodiment, the inventors have fabricated organic EL devices of a conventional example and organic EL devices of the examples 1 to 4, and compared the light-emitting efficiency.

The results will be described below.

The conventional example is the organic EL device laminated layers on the substrate not having the recesses as shown in FIG. 9(A).

The examples 1 to 3 are organic EL devices in which the upper surface 12a of the filling layer 12 is at a position that is lower than the plane Q as shown in FIG. 3, and the depths d1 of the recesses are mutually different.

The example 4 is an organic EL device in which the upper surface 12a of the filling layer 12 is on the same plane as the plane Q.

In all examples, green light-emitting elements have been fabricated.

In the present embodiment, the center angles of the arcs, which are the cross-sectional shapes of the recesses, are used as a parameter representing the depth of the recesses.

As shown in the FIGS. 10(A) and (B), the diameter φ of the circle when the recess 9 is seen in plan view is kept constant and the cross-sectional shape of the recess 9 is made an arc shape. Therefore, the depth d1 of the recess 9 is shown by the central angle θ of the arc. That is, if the depth d1 of the recess 9 is deep, the central angle θ is large, and if the depth d1 of the recess 9 is shallow, the central angle is small.

The central angles θ of the organic EL device of example 1 was made 30°, and the central angle of the organic EL device of example 2 was made 110°. Therefore, the recess depth d1 becomes deeper progressing in the sequence of example 1→example 2→example 3.

The central angle θ of the organic EL device of example 4 was made 80°.

Regarding the light extraction efficiency, in addition to measuring the frontal luminance of light emitted from each organic EL device using a spectroradiometer, the intensity of the total light flux was measured using an integrating sphere. Table 2 shows the frontal luminance and total light flux intensity of the organic EL devices of examples 1 to 4. The frontal luminance and total light flux intensity are indicated as relative intensities, with the values for the convention example not having a recess taken as 100.

TABLE 2

|  | Conventional example No recess structure | Example 1 | Example 2 | Example 3 | Example 4 |
| --- | --- | --- | --- | --- | --- |
|  |  | $d_2 = 0.1$ mm | | | $d_2 = 0$ |
|  |  | θ: 30° | θ: 80° | θ: 110° | θ: 80° |
| Frontal luminance (10°) | 100 | 180 | 240 | 100 | 220 |
| Total light flux | 100 | 190 | 210 | 190 | 195 |

As can be seen from the results in Table 2, in the case of the organic EL devices of examples 1 to 4, by having a recess, the frontal luminance and total light flux intensity are increased compared to the conventional example. As can been seen from the results of examples 1 to 3, the degree of the effect of improvement of the frontal luminance and the total light flux intensity differs, depending upon the depth and the shape of the recess. This result is suspected to be caused by differences in light-collection effect depending upon the shape of the recess.

Comparing examples 2 and 4, which have central angles θ of 80° that coincide, the effect of example 2 is higher for both the frontal luminance and the total light flux intensity. This is thought to be because the efficiency of capturing light emitted at an angle close to straight sideways from the light-emitting layer into the reflective layer of the recess is higher in example 2. In the present invention, therefore, it is verified that, by forming a filling layer in the recess and also, rather than completely filling the filling layer, by forming the upper surface of the filling layer at a position lower than the upper surface of the base material, the efficiency of extracting light is increased.

As noted above, according to the present embodiment, by appropriately changing the depth of the recess, the frontal luminance is sufficiently increased, thereby obtaining an organic EL device having strong directionality. Conversely, although the frontal luminance is not that high, it is possible to obtain an organic EL device having a high overall luminance. In either case, it has been verified that, according to the present invention, the light extraction efficiency is sufficiently increased. Although the present embodiment shows specific values regarding a green light-emitting element, the same results are obtained regarding a red light-emitting element and a blue light-emitting element.

(Second Embodiment)

The second embodiment of the present invention will be described below, using FIG. 11.

The basic constitution of the organic EL device of the second embodiment is the same as that of the first embodiment, and the material of the filling layer is different from that of the first embodiment.

FIG. 11 is a cross-sectional view of an organic EL device of the second embodiment.

In FIG. 11, constituent elements that are in common with those of FIG. 3 used in the first embodiment are assigned the same reference symbols, and the detailed descriptions thereof will be omitted.

In the first embodiment, a resin material having a refractive index of 1.5 has been used as the filling layer. In contrast, in the organic EL device 31 of the present embodiment, as shown in FIG. 11, resin having a refractive index of 1.8 or 1.9 is used as the constituent material of the filling layer 32. The other parts of the constitution are the same as in the first embodiment. The resin material having a refractive index of 1.8 or 1.9 can be made, for example, by mixing an appropriate amount of zirconia nanoparticles into an olefin-based resin having a refractive index of 1.65. The refractive index can be adjusted by changing the mixing proportion of the zirconia nanoparticles. Additionally, regarding an organic EL device having a filling layer made from a resin with a refractive index of 1.9, the refractive index of the ITO constituting the first electrode 4 is adjusted to 1.9. Although the refractive index of ITO is generally approximately 2.0, the film growth condition ITO can be changed to lower the refractive index of ITO to approximately 1.9 by making the film density lower than it normally is.

In the organic EL device of the present invention, light emitted from the light-emitting layer is guided to the filling layer, reflected at the reflective layer, and extracted from the upper surface. In this light guiding path, the constituent element having the highest refractive index is the first electrode 4. In accordance with Snell's Law, although light can enter a substance having a high refractive index from a substance having a low refractive index, there is a component that is totally reflected at the boundary and cannot enter from a substance having a high refractive index into a substance having a low refractive index. For that reason, with the constitution of the first embodiment, a part of the light striking the first electrode 4 cannot enter the filling layer 12, which has a refractive index lower than that of the first electrode 4, and is reflected at the boundary between the first electrode 4 and the filling layer 12.

To reduce this type of light loss, it is desirable to make the refractive index differences between the light-emitting layer and the filling layer and between the first electrode and the filling layer as small as possible. In the organic EL device 31 of the present embodiment, the refractive index of the filling layer 32 is made 1.8 or 1.9, which is substantially the same as the refractive indexes of the organic layer 5 and the first electrode 4. This enables the provision of an organic EL device 31 having a higher light usage efficiency.

To verify the effect of the organic EL device 31 of the present embodiment, the inventors have fabricated an organic EL device of a conventional example and organic EL devices of examples 5 and 6 and have compared the light extraction efficiencies.

The results are shown below.

The conventional example is an organic EL device that has the various layers laminated onto a substrate not having a recess.

Example 5 is an organic EL device having a filling layer with a refractive index of 1.8. Example 6 is an organic EL device having a filling layer with a refractive index of 1.9. The central angles θ of the organic EL devices of examples 5 and 6 had been made 80°.

Green light-emitting elements had been fabricated for all the examples.

Table 3 shows the frontal luminance and total light flux intensity of the organic EL devices of the conventional example and of examples 5 and 6. The frontal luminance and the total light flux intensity are indicated as relative intensities, with reference to the values for the conventional example without the recess taken as 100. Additionally, in the Table 2, for the purpose of comparison an organic EL device (example 2) having a filling layer with a refractive index of 1.5 is also shown.

TABLE 3

|  | Conventional example No recess structure | Example 2 | Example 5 | Example 6 |
| --- | --- | --- | --- | --- |
|  |  | Filling layer refractive index | | |
|  |  | 1.5 | 1.8 | 1.9 |
| Frontal luminance | 100 | 240 | 250 | 240 |
| Total light flux | 100 | 210 | 220 | 210 |

As is clear from Table 3, according to the organic EL devices of examples 5 and 6, in which the refractive index of the filling layer is adjusted to near the refractive index of the organic layer and the first electrode, it is possible to further improve the light extraction efficiency, compared to that of example 2 (first embodiment).

(Third Embodiment)

The third embodiment of the present invention will be described below, using FIG. 12.

The basic constitution of the organic EL device of the third embodiment is the same as that of the first embodiment, and the constitution of the reflective layer is different from that of the first embodiment.

FIG. 12 is a cross-sectional view showing the organic EL device of the third embodiment.

In FIG. 12, constituent elements that are in common with those of FIG. 3 used in the first embodiment are assigned the same reference symbols, and the detailed descriptions thereof will be omitted.

In the first embodiment, a metal material such as aluminum has been used as the reflective layer. In contrast, in the organic EL device 41 of the present embodiment, a multilayer dielectric film is used as the reflective layer 43 as shown in FIG. 12. The multilayer dielectric film, for example, has a constitution in which a high-refractive index material such as $TiO_3$, $Ta_2O_3$ or the like is alternately laminated with a low-refractive index material such as $SiO_2$, $MgF_2$ or the like. It is desirable that the laminated structure of the multilayer dielectric film be designed and formed so that the reflection band is broadened to obtain substantially 100% reflectivity regardless of the angle of incidence over the visible light band. Other parts of the constitution are the same as in the first embodiment.

The reflectivity of aluminum is approximately 90% and the reflectivity of silver is approximately 95%. That is, the reflectivity of a metal film is not 100%. For that reason, there is a loss of intensity every time light is reflected from the metal film. When a metal film is used in the reflective layer 3, such as in the first embodiment, there is a loss occurring each time light is reflected by the reflective layer 3. As shown by the light path in FIG. 9(B), in the process of light exiting from the upper surface of the second electrode 6, because there are almost no cases in which the light is reflected by the reflective layer 3 a large number of times, the loss of light by reflection is limited. However, the intensity of light decreases at least approximately 5 to 10% by even one reflected by the reflective layer 3. In contrast, the reflectivity of the multilayer dielectric film is substantially 100%. Thus, if a multilayer dielectric film is used in the reflective layer 43, such as in the present embodiment, there is almost no loss of light by reflection. This enables the provision of an organic EL device 41 having a higher light usage efficiency.

To verify the effect of the organic EL device of the present embodiment, the inventors have fabricated an organic EL device of a conventional example and an organic EL device of example 7 and have compared the light extraction efficiencies.

The results are shown below.

The conventional example is an organic EL device that has the various layers laminated onto a substrate not having a recess.

Example 7 is an organic EL device having a reflective layer that is a multilayer dielectric film. The central angle θ of the organic EL device of example 7 has been made 80°.

Green light-emitting elements have been fabricated for all the examples.

Table 4 shows the frontal luminance and total light flux intensity of the organic EL devices of the conventional example and of example 7. The frontal luminance and the total light flux intensity are indicated as relative intensities, with reference to the values for the conventional example without the recess taken as 100. Additionally, in Table 4, for the purpose of comparison an organic EL device (example 2) having a reflective layer made of an aluminum film is also shown.

TABLE 4

|  | Conventional example No recess structure | Example 2 | Example 7 |
| --- | --- | --- | --- |
|  |  | Reflective layer | |
|  |  | Aluminum | Multilayer dielectric film |
| Frontal luminance | 100 | 240 | 250 |
| Total light flux | 100 | 210 | 220 |

As is clear from Table 4, according to the organic EL device of example 7, which has a reflective layer made of a multilayer dielectric film, it is possible to further improve the light extraction efficiency, compared to that of example 2 (first embodiment).

(Fourth Embodiment)

The fourth embodiment of the present invention will be described below, using FIG. 13.

The basic constitution of the organic EL device of the fourth embodiment is the same as that of the first embodiment, and the constitution of the reflective layer is different from that of the first embodiment.

FIG. 13 is a cross-sectional view showing the organic EL device of the fourth embodiment.

In FIG. 13, constituent elements that are in common with those of FIG. 3 used in the first embodiment are assigned the same reference symbols, and the detailed descriptions thereof will be omitted.

In the first embodiment, a metal material such as aluminum has been used as the reflective layer. In contrast, in the organic EL device 51 of the present embodiment, a scattering layer having light scattering properties is used as the reflective layer 53. The scattering layer can be formed, for example, by coating a barium sulfate solution. The reflectivity of the film of a barium sulfate is substantially 98%. Other parts of the constitution are the same as in the first embodiment.

As noted in the third embodiment as well, because the reflectivity of a metal film generally does not reach 100%, the light intensity decreases by reflection. If a metal film is used in the reflective layer 3, as in the first embodiment, loss of light occurs each time light is reflected by the reflective layer 3. If light that has progressed in a direction close to be straight sideways from the organic layer 5 and light totally reflected at the boundary between the first electrode 4 and the filling layer 12 strike the edge part of the recess 9, because of the specular reflection at the reflective layer 3, which is made of a metal film, the light progresses that angle in the opposite direction, and there are cases in which the light cannot be extracted to the outside. In contrast, if a scattering layer is used in the reflective layer 53, as in the present embodiment, light reflected by the reflective layer 53 progresses in all directions. For that reason, a part of the light that could not be extracted to the outside when a metal film had been used in the reflective layer can be extracted by using a scattering layer in the reflective layer. Also, because the reflectivity of the scattering layer is at least the same as that of a metal film, the loss of light by reflection can be reduced. Because of these factors, it is possible to provide an organic EL device 51 having a higher light usage efficiency.

To verify the effect of the organic EL device of the present embodiment, the inventors have fabricated an organic EL device of a conventional example and an organic EL device of example 8 and have compared the light extraction efficiencies.

The results are shown below.

The conventional example is an organic EL device that has the various layers laminated onto a substrate not having a recess.

Example 8 is an organic EL device having a reflective layer made of a barium sulfate scattering layer. The central angle θ of the organic EL device of example 8 has been made 80°.

Green light-emitting elements have been fabricated for all the examples.

Table 5 shows the frontal luminance and total light flux intensity of the organic EL devices of the conventional example and of example 8. The frontal luminance and the total light flux intensity are indicated as relative intensities, with reference to the values for the conventional example without the recess taken as 100. Additionally, in the Table 5, for the purpose of comparison an organic EL device (example 2) having a reflective layer made of an aluminum film is also shown.

TABLE 5

|  | Conventional example No recess structure | Example 2 Reflective layer Aluminum | Example 8 Reflective layer Scattering layer |
|---|---|---|---|
| Frontal luminance | 100 | 240 | 250 |
| Total light flux | 100 | 210 | 220 |

As is clear from Table 5, according to the organic EL device of example 8, which has a reflective layer made of a scattering layer, it is possible to further improve the light extraction efficiency, compared to that of example 2 (first embodiment).

(Fifth Embodiment)

The fifth embodiment of the present invention will be described below, using FIG. 14 and FIG. 15.

The basic constitution of the organic EL device of the fifth embodiment is the same as that of the first embodiment, and the constitution of the recess is different from that of the first embodiment.

FIG. 14 is a plan view showing the organic EL device of the fifth embodiment. FIG. 15 is a cross-sectional view along the line B-B' of FIG. 14.

In FIG. 14 and FIG. 15, constituent elements that are in common with those of FIG. 2 and FIG. 3 used in the first embodiment are assigned the same reference symbols, and the detailed descriptions thereof will be omitted.

The organic EL device 61 of present embodiment, as shown in FIG. 14, has a unit light-emitting region 11 provided with a plurality of recesses 62 and 63 with circular planar shapes in a matrix arrangement. The radii of the circles that are the planar shapes of the recesses 62 and 63 are the same for all the recesses.

In this manner, when the recesses 62 and 63 are seen in plan view, they have common shapes and dimensions. As shown in FIG. 15, however, when the recesses 62 and 63 are viewed in cross-section, the recesses 62 and 63 have two types of different shapes and depths, mixed within one unit light-emitting region. Specifically, focusing on a plurality of columns of recesses that are aligned vertically in FIG. 14, there is an alternating arrangement of columns constituted by the first recesses 62, which are shallow, and columns constituted by the second recesses 63, which are deep. For example, the recesses 62 of the column at the left edge are shallow, the recesses 63 of the second column from the left are deep, and the columns from the third from the left repeat this. Of the overall number of recesses in the unit light-emitting region 11, ½ are the first recesses 62, and the remaining ½ are the second recesses 63. For example, an example of the shape of recesses is a central angle θA of 30° for the first recesses 62 and a central angle θB of 80° for the second recesses 63.

As shown in Table 2 in the first embodiment, the frontal illumination improvement effect and total light flux intensity improvement effect differ, depending on the shape (depth) of the recesses. According to Table 2, for example, if the central angle θ is 30°, although the frontal luminance does not change from the conventional example, the total light flux intensity is substantially doubled. In contrast, if the central angle θ is 80°, the frontal luminance is 2.4 times that of the conventional example. That is, the directionality and the total amount of light extracted can be controlled by the shape of the recesses. In the present embodiment, utilizing this point, by forming recesses 62 and 63 that have different shapes within one unit light-emitting region 11, an organic EL device 61 can be obtained that has the desired directionality and light extraction efficiency.

To verify the effect of the organic EL device of the present embodiment, the inventors have fabricated an organic EL device of a conventional example and examples 9 and 10 of organic EL devices reflecting the constitution of the present embodiment and have compared the light extraction efficiencies.

The results are shown below.

The conventional example is an organic EL device that has the various layers laminated onto a substrate not having a recess.

Example 9 is an organic EL device with a mixing ratio of the first recesses to the second recesses of 1:1.

Example 10 is an organic EL device with a mixing ratio of the first recesses to the second recesses of 2:1.

The mixing ratio is the ratio, within one unit light-emitting region, of the number of first recesses to the number of second recesses. The central angle θA of the first recesses has been made 30°, and the central angle θB of the second recesses has been made 80°. Green light-emitting elements have been fabricated for all the examples.

Table 6 shows the frontal luminance and the total light flux intensity of the organic EL device of the convention example and of examples 9 and 10. The frontal luminance and the total light flux intensity are indicated as relative intensities, with reference to the values for the conventional example without the recess taken as 100. Additionally, in Table 6, for the purpose of comparison an organic EL device (example 1) having only recesses with a central angle θ of 30° and an organic EL device (example 2) having only recesses with a central angle θ of 80° are also shown.

TABLE 6

|  | Conventional example No recess structure | Example 1 θ: 30° | Example 2 θ: 80° | Example 9 θA:θB = 1:1 | Example 10 θA:θB = 2:1 |
| --- | --- | --- | --- | --- | --- |
| Frontal luminance (10°) | 100 | 100 | 240 | 170 | 140 |
| Total light flux | 100 | 190 | 210 | 200 | 193 |

As is clear from Table 6, it can be seen that, according to the organic EL devices of examples 9 and 10, in which first recesses having a central angle θA of 30° and second recesses having a central angle θB of 80° have been mixed, values have been taken that were intermediate between examples 1 and 2, in which only one of the recesses are provided. It is also seen that each of the frontal luminance and the total light flux intensity can be controlled by changing the mixing ratio of the recesses.

(Sixth Embodiment)

The sixth embodiment of the present invention will be described below, using FIG. 16.

The basic constitution of the organic EL device of the sixth embodiment is the same as that of the first embodiment, and the constitution of the unit light-emitting region is different from that of the first embodiment.

FIG. 16 is a plan view showing the organic EL device of the sixth embodiment.

In FIG. 16, constituent elements that are in common with those FIG. 2 used in the first embodiment are assigned the same reference symbols, and the detailed descriptions thereof will be omitted.

The present embodiment shows an example of an organic EL device applied to a display device, for example, having a plurality of pixels disposed in a matrix arrangement.

As shown in the FIG. 16, the organic EL device 71 of the present embodiment has a plurality of pixels P disposed in a matrix arrangement. One pixel P is constituted by two sub-pixels, a first sub-pixel SPA and a second sub-pixel SPB. Each of the first sub-pixel SPA and the second sub-pixel SPB corresponds to a unit light-emitting region of the first to fifth embodiments. Each of the first sub-pixel SPA and the second sub-pixel SPB is rectangularly shaped. The dimensions of both the first sub-pixel SPA and the second sub-pixel SPB are 200 μm vertically and 100 μm horizontally.

The first sub-pixel SPA corresponds to the first unit light-emitting region of the claims, and the second sub-pixel SPB corresponds to the second unit light-emitting region of the claims.

Each of the first sub-pixel SPA and the second pixel SPB can have electric fields applied thereto (be driven) independently. In the present embodiment, a plurality of data lines 72 and a plurality of scanning lines 73 are provided on a substrate, and sub-pixels SPA and SPB are provided in regions surrounded by adjacent data lines 72 and adjacent scanning lines 73. The first electrode described in the first embodiment is divided for each sub-pixel, and each individual first electrode is connected to a data line 72 and a scanning line 73, via a switching element 74, such as a thin-film transistor (hereinafter TFT). That is, the organic EL device 71 of the present embodiment is an active-matrix type organic EL device. Although in this case, an active-matrix scheme using TFTs is adopted, in which the constitution is such that electric fields are applied to each of the sub-pixels SPA and SPB independently, this scheme is not a restriction and, for example, a scheme such as a simple matrix or segment drive may be adopted.

Focusing on a plurality of columns of sub-pixels arranged along the data lines 72, columns of the first sub-pixels SPA having first recesses 75 that are shallow and columns of the second sub-pixel SPB having second recesses 76 that are deep are alternately disposed. For example, the first recesses 75 of the column of first sub-pixels SPA at the left edge are shallow, and the second recesses 76 of the column of second sub-pixel SPB second from the left are deep, and the columns from the third from the left repeat this. For example, an example of the shape of recesses is a central angle θA of 30° for the first recesses 75 and a central angle θB of 80° for the second recesses 76.

As shown in Table 2 in the first embodiment, the frontal illumination improvement effect and total light flux intensity improvement effect differ, depending on the shape (depth) of the recesses. According to Table 2, for example, if the central angle θ is 30°, although the frontal luminance does not change from the conventional example, the total light flux intensity is substantially double that of the conventional example. In contrast, if the central angle θ is 80°, the frontal luminance is 2.4 times that of the conventional example. That is, the directionality and the total amount of light extracted can be controlled by the shape of the recesses.

Because the dimensions of each of the sub-pixels SPA and SPB are sufficiently small in the present embodiment, the light emitted from the organic EL device 71 overall is light that is synthesized of the light emitted from each of the sub-pixels SPA and SPB. Therefore, the light emitted from the recesses 75 and 76 that are different is a synthesized light that reflects the characteristics thereof. In the present embodiment, utilizing this point, by forming recesses 75 and 76 that have different shapes for each of the sub-pixels SPA and SPB and by driving these sub-pixels SPA and SPB independently, an organic EL device 71, which has adjustable desired directionality and light extraction efficiency, can be obtained.

To verify the effect of the organic EL device of the present embodiment, the inventors have fabricated an organic EL device of example 11 reflecting the constitution of the present embodiment and have compared the frontal luminance as the ratio of the currents applied to the first sub-pixels SPA and the second sub-pixels SPB has been changed.

Table 7 shows the frontal luminance of the organic EL device of example 11. The frontal luminance is indicated as a relative value, with current applied to only the first sub-pixels SPA has been taken as 100. The applied current ratio in Table 7 is the proportion of current applied to the second sub-pixels SPB when the total of the currents applied to the first sub-pixels SPA and the second sub-pixels SPB is taken to be 100.

TABLE 7

| | Applied current ratio to second sub-pixels SPB | | | |
|---|---|---|---|---|
| | 0 | 30 | 50 | 100 |
| Frontal luminance (10°) | 100 | 140 | 170 | 240 |

As is clear from Table 7, it can be seen that, with the applied current ratio of 100, that is, when current is applied to only the second sub-pixels SPB, the frontal luminance is 2.4 times the frontal luminance when current is applied to only the first sub-pixels SPA, it being possible to emit a stronger light in the normal direction of the organic EL device. Conversely, when the applied current ratio is 0, that is, when current is applied to only the first sub-pixels SPA, the frontal luminance is smaller than the frontal luminance when current is applied to only the second sub-pixels SPB, enabling light emission over a broader direction range. Therefore, it has been seen that the directionality of the light emitted from even one organic EL device can be switched, by whether current is applied to only the first sub-pixels SPA or to only the second sub-pixels SPB.

Additionally, it has been seen that, if the ratio of the current value applied to the first sub-pixels SPA to the current value applied to the second sub-pixels SPB is changed, such as the cases in which the applied current ratio of the second sub-pixels SPB is 30 and 50, a frontal luminance that is intermediate between the cases in which current is applied to only one of the sub-pixels is indicated. In this manner, by changing the current ratio applied to each of sub-pixels, it has been seen that the frontal luminance can be controlled.

The technical scope of the present invention is not restricted to the above-noted embodiments, and can be subjected to various modifications, within the scope of the spirit of the present invention.

In the above-noted embodiments, although the description has been for the example in which the cross-sectional shape of the recess is an arc, the cross-sectional shape of the recess need not be an arc, and may include an elliptical or an arbitrary curve, and may include in part a straight line.

Although in the fifth and sixth embodiments the example having two types of recesses with mutually different shapes, there may be three or more types of recesses with different shapes. In addition, the specific constitution, such as the shapes, dimensions, numbers, disposition, constituent materials, and formation process of the various parts of the organic EL devices are not restricted to those noted above, and may be changed as appropriate.

An organic EL device of the present invention, in addition to a display device, can be applied to an illumination device or the like. For example, if the present invention is applied to an illumination device that generates white light, it is not necessary to have a plurality of unit light-emitting regions of different emitted colors that are mutually divided, as shown by example in the above embodiments. Specifically, for example, three types of dopant dyes of red, green, and blue may be doped into one light-emitting layer, the structure may be one of a laminate of a blue hole transport light-emitting layer, a green electron transport light-emitting layer, and a red electron transport light-emitting layer, and the structure may be one of a laminate of a blue electron light-emitting transport layer, a green electron transport light-emitting layer, and a red electron transport light-emitting layer.

INDUSTRIAL APPLICABILITY

The present invention can be used in arbitrary electronic devices that have a light emitting part, such as a display device or an illumination device.

DESCRIPTION OF THE REFERENCE SYMBOLS 1, 31, 41, 51, 61, 71 Organic EL device (illumination device, display device)
2 Base material
2a Upper surface (of base material)
3, 43, 53 Reflective layer
4 First electrode
5 Organic layer
6 Second electrode
9 Recess
11, 11R, 11G, 11B Unit light-emitting region
12, 32 Filling layer
16 Light-emitting layer
62, 75 First recess
63, 76 Second recess

The invention claimed is:

1. An organic electroluminescence device comprising:
a base material in which a recess is provided at an upper surface of the base material;
a reflective layer that is provided at least along a surface of the recess;
a filling layer that is filled into an inside of the recess via the reflective layer, the filling layer having light transmissivity;
a first electrode that is provided at least on a layer above the filling layer, the first electrode having light transmissivity;
an organic layer that is provided on a layer above the first electrode, the organic layer comprising at least a light-emitting layer; and
a second electrode that is provided on a layer above the organic layer, the second electrode having light transmissivity and light reflectivity,
wherein one of a first condition and a second condition is satisfied,
the first condition is that a part of the reflective layer contacts a part of the first electrode, and
the second condition is that a lower surface of the first electrode at a position in the recess is positioned lower than a plane that includes the upper surface of the base material.

2. The organic electroluminescence device according to claim 1,
wherein a lower surface of the light-emitting layer at a position in the recess is positioned below a plane that includes the upper surface of the base material.

3. The organic electroluminescence device according to claim 1, wherein the second electrode is constituted by a metal film.

4. The organic electroluminescence device according to claim 1,
wherein a cross-section shape of the recess cut by an arbitrary plane that is perpendicular to the upper surface of the base material is an arc.

5. The electroluminescence device according to claim 1,
wherein the first electrode is provided so as to contact an upper surface of the filling layer, and
a refractive index of the filling layer is substantially same as a refractive index of the first electrode.

6. The electroluminescence device according to claim 1,
wherein a refractive index of the filling layer is substantially same as a refractive index of the light-emitting layer.

7. The electroluminescence device according to claim 1,
wherein the reflective layer is constituted by a multilayer dielectric film.

8. The electroluminescence device according to claim 1,
wherein the reflective layer has light scattering properties.

9. The electroluminescence device according to claim 1,
wherein the electroluminescence device comprises a plurality of unit light-emitting regions,
the recess comprises at least a first recess and a second recess having mutually different shapes, and
the first recess and second recess are provided within one unit light-emitting region.

10. The electroluminescence device according to claim 1,
wherein the electroluminescence device comprises a plurality of unit light-emitting regions,
the recess comprises at least a first recess and a second recess having mutually different shapes,
the plurality of unit light-emitting regions comprise at least a first unit light-emitting region having the first recess and a second unit light-emitting region having the second recess.

11. The electroluminescence device according to claim 10,
wherein the first unit light-emitting region and the second unit light-emitting region are each driven independently.

12. A method for manufacturing an organic electroluminescence device, the method comprising:
forming a recess at an upper surface of a base material;
forming a reflective layer at least along a surface of the recess;
forming a filling layer inside the recess via the reflective layer, the filling layer having light transmissivity;
forming a first electrode at least on a layer above the filling layer, the first electrode having light transmissivity;
forming an organic layer on a layer above the first electrode, the organic layer comprising at least a light-emitting layer; and
forming a second electrode on a layer above the organic layer, the second electrode having light transmissivity and light reflectivity,
wherein one of a first condition and a second condition is satisfied,
the first condition is that, in the forming of the first electrode, the first electrode is formed so that a part of the first electrode contacts a part of the reflective layer, and
the second condition is that, in the forming of the first electrode, the first electrode is formed so that a lower surface of the first electrode in a position in the recess is positioned lower than a plane that includes the upper surface of the base material.

13. An illumination device comprising:
the organic electroluminescence device according to claim 1.

14. A display device comprising:
the organic electroluminescence device according to claim 1.

* * * * *